United States Patent
Butt et al.

(10) Patent No.: US 7,437,500 B2
(45) Date of Patent: Oct. 14, 2008

(54) CONFIGURABLE HIGH-SPEED MEMORY INTERFACE SUBSYSTEM

(75) Inventors: Derrick Sai-Tang Butt, San Leandro, CA (US); Cheng-Gang Kong, Saratoga, CA (US); Terence J. Magee, San Francisco, CA (US)

(73) Assignee: LSI Corporation, Milpitas, CA (US)

( * ) Notice: Subject to any disclaimer, the term of this patent is extended or adjusted under 35 U.S.C. 154(b) by 305 days.

(21) Appl. No.: 11/198,416

(22) Filed: Aug. 5, 2005

(65) Prior Publication Data

US 2007/0033337 A1 Feb. 8, 2007

(51) Int. Cl.
*G06F 12/00* (2006.01)

(52) U.S. Cl. ............... 711/105; 711/4; 711/100; 711/106; 711/111; 365/189.011; 365/189.01; 365/189.02; 365/189.03; 365/189.04; 365/189.05; 365/189.14; 365/189.15; 365/189.16; 365/189.17; 365/189.18; 365/191; 365/193; 365/194; 365/195; 365/223; 365/233.11; 365/233.13

(58) Field of Classification Search ........... 711/100, 711/4, 105–106, 111; 365/189.04, 194, 189.011, 365/189.01–189.05, 189.14–189.18, 191, 365/193–195, 233.11, 233.13

See application file for complete search history.

(56) References Cited

U.S. PATENT DOCUMENTS

| | | | | |
|---|---|---|---|---|
| 6,601,126 B1* | 7/2003 | Zaidi et al. | ........... | 710/305 |
| 7,132,866 B2* | 11/2006 | Jiang | ........... | 327/158 |
| 7,177,208 B2* | 2/2007 | Smith et al. | ........... | 365/194 |
| 2004/0117566 A1* | 6/2004 | McClannahan et al. | ..... | 711/154 |
| 2006/0023698 A1* | 2/2006 | Shore et al. | ........... | 370/352 |

* cited by examiner

*Primary Examiner*—Sanjiv Shah
*Assistant Examiner*—Zhuo H Li
(74) *Attorney, Agent, or Firm*—Christopher P. Maiorana, PC

(57) ABSTRACT

A core including a write logic IP block, a read logic IP block, a master delay IP block and an address and control IP block. The write logic IP block may be configured to communicate data from a memory controller to a double data rate (DDR) synchronous dynamic random access memory (SDRAM). The read logic IP block may be configured to communicate data from the double data rate (DDR) synchronous dynamic random access memory (SDRAM) to the memory controller. The master delay IP block may be configured to generate one or more delays for the read logic IP block. The address and control logic IP block may be configured to control the write logic IP block and the read logic IP block. The core is generally configured to couple the double data rate (DDR) synchronous dynamic random access memory (SDRAM) and the memory controller.

18 Claims, 27 Drawing Sheets

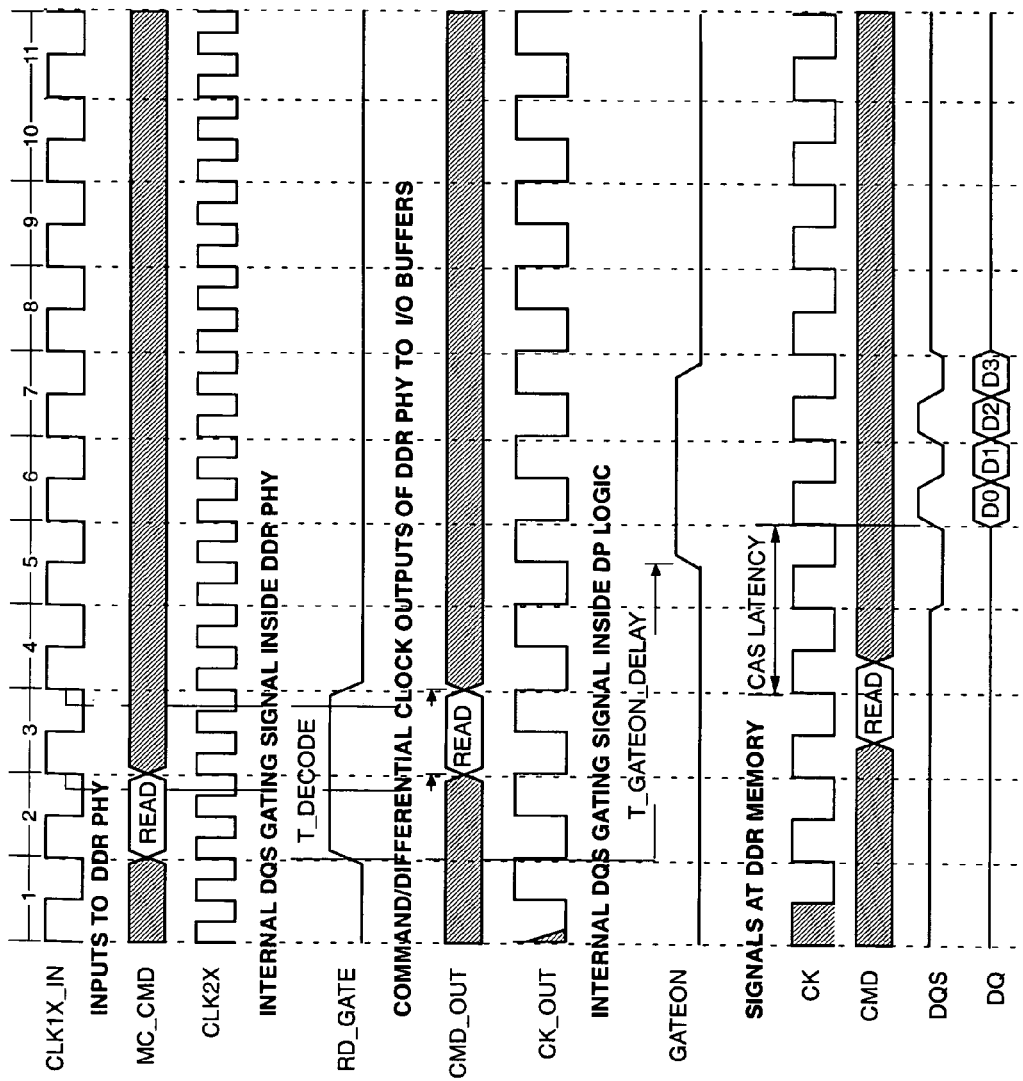

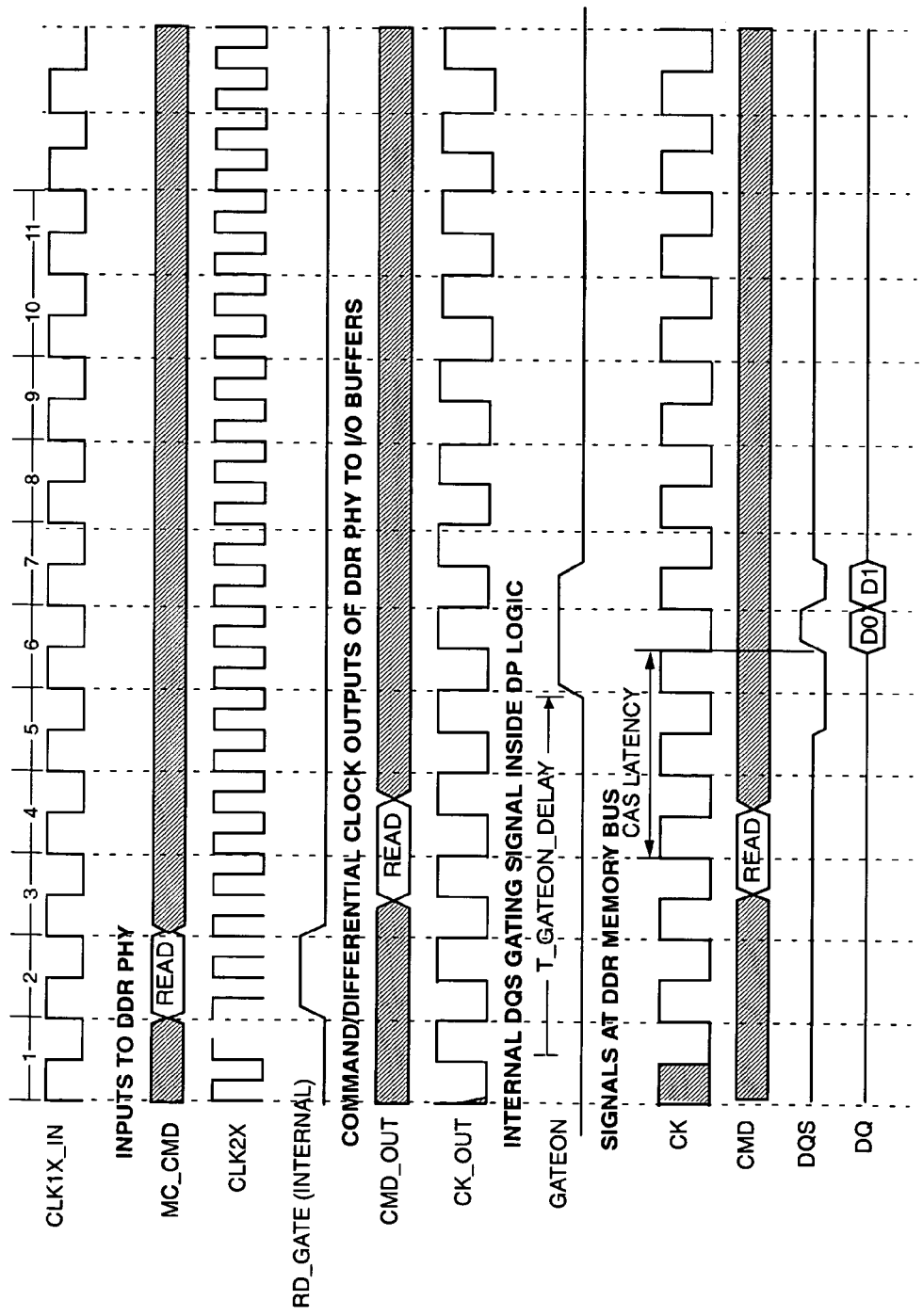

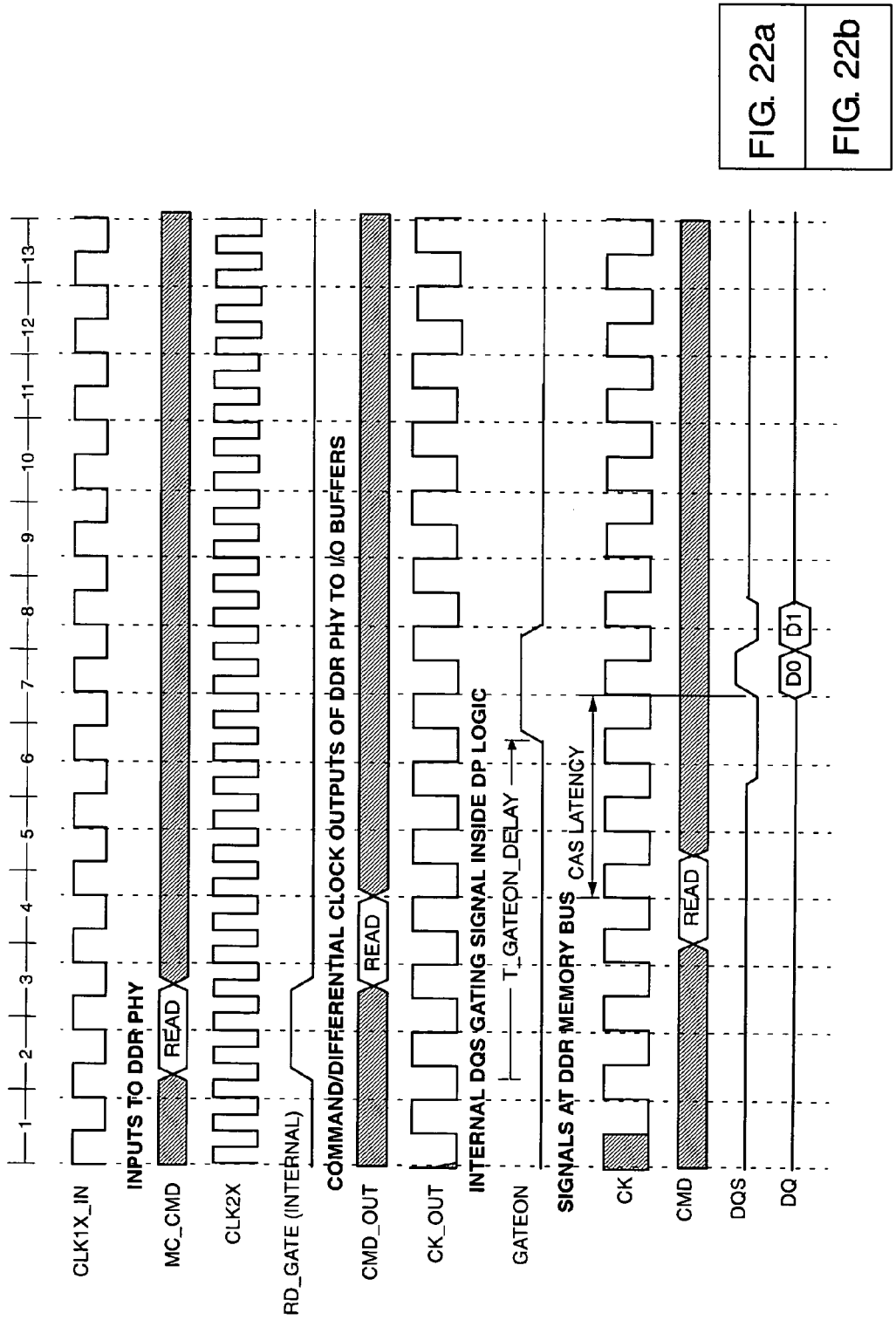

US 7,437,500 B2

CONFIGURABLE HIGH-SPEED MEMORY INTERFACE SUBSYSTEM

FIELD OF THE INVENTION

The present invention relates to memory interfaces generally and, more particularly, to a configurable high-speed memory interface subsystem.

BACKGROUND OF THE INVENTION

Conventional approaches for interfacing a memory controller function with a double data rate (DDR) synchronous dynamic random access memory (SDRAM) use hard-coded intellectual property (IP) blocks for specific DDR SDRAM memory applications. For different data bus width applications, different physical interfaces are created. On the receive data path, the conventional approach is to perform a detailed SPICE (simulation program for integrated circuit emphasis) timing analysis and to carefully construct the read data path, such that the receive data can be re-synchronized to the memory controller function.

The conventional approaches do not have the flexibility to apply a particular physical interface IP for different DDR SDRAM memory bus configurations. The conventional approaches restrict the re-use of the physical interface IP in applications that have different system topologies. In addition, the conventional approaches build discrete low-level logic functions to handle the impedance update control of the IO buffers and one-quarter or one-fifth cycle delay tracking on the receive data path.

It would be desirable to have a configurable high-speed memory interface subsystem.

SUMMARY OF THE INVENTION

The present invention concerns a core including a write logic IP block, a read logic IP block, a master delay IP block and an address and control IP block. The write logic IP block may be configured to communicate data from a memory controller to a double data rate (DDR) synchronous dynamic random access memory (SDRAM). The read logic IP block may be configured to communicate data from the double data rate (DDR) synchronous dynamic random access memory (SDRAM) to the memory controller. The master delay IP block may be configured to generate one or more delays for the read logic IP block. The address and control logic IP block may be configured to control the write logic IP block and the read logic IP block. The core is generally configured to couple the double data rate (DDR) synchronous dynamic random access memory (SDRAM) and the memory controller.

The objects, features and advantages of the present invention include providing a configurable high-speed memory interface subsystem that may (i) provide compile time configurable bus widths of the physical interface IP, (ii) provide complete physical interfaces for DDR2/DDR1 SDRAM memory applications, (iii) provide automatic data alignment of receive data over PVT using synchronous read FIFOs, (iv) provide automatic one-quarter or one-fifth cycle clock forwarding over PVT on the receive data path, (v) provide in phase data transfer (transmit and receive) to enable implementation of proprietary chip-to-chip DDR interfaces, (vi) support upper level system software functions (e.g., read data strobe Gating and read data strobe centering techniques) for DDR2/DDR1 SDRAM memory applications, (vii) control automatic impedance update function for the IO buffers, (viii) provide reusable IP in a variety of DDR applications (e.g., DDR1, DDR2, or chip-to-chip proprietary DDR interfaces), (ix) provide IP that supports different bus configurations or different system bus topologies, (x) enable easy product implementation, (xi) provide a migration path by providing similar physical interfaces to upper level memory controller function and/or (xii) provide a subsystem function that encapsulates all low-level physical data transfer and IO buffer housekeeping functions for the DDR2/DDR1/proprietary DDR interfaces.

BRIEF DESCRIPTION OF THE INVENTION

These and other objects, features and advantages of the present invention will be apparent from the following detailed description and the appended claims and drawings in which:

DETAILED DESCRIPTION OF THE PREFERRED EMBODIMENTS

Figure 1:
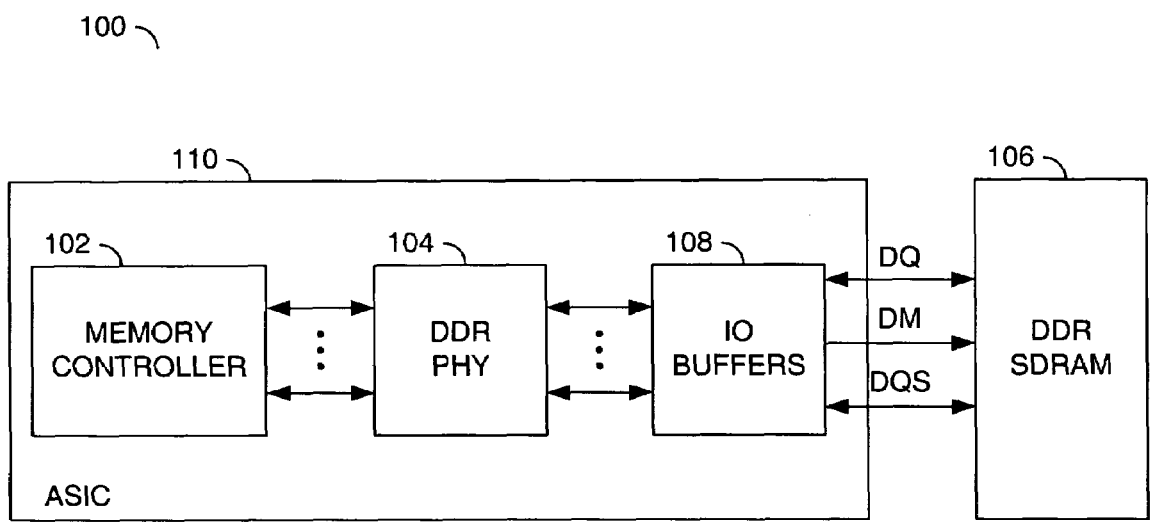
FIG. 1 is a block diagram illustrating a memory system in which an embodiment of the present invention may be implemented.

Referring to FIG. 1, a block diagram is shown illustrating a system 100 in which one or more preferred embodiments of the present invention may be implemented. In one example, the system 100 may comprise a circuit (or block) 102, a circuit (or block) 104, a circuit (or block) 106 and a circuit (or block) 108. The circuit 102 may be implemented as a memory controller. The circuit 104 may be implemented as a memory interface. In one example, the circuit 104 may be implemented as a double data rate (DDR) physical layer core (PHY). The circuit 106 may be implemented as one or more double data rate (DDR) synchronous dynamic random access memory (SDRAM) devices. The circuit 108 may be implemented, in one example, as stub series terminated logic (SSTL) IO buffers. In one example, the IO buffers 108 may be implemented as SSTL-2 buffers. The circuit 104 may be coupled between the circuit 102 and the circuit 106. In one example, the circuit 104 may be coupled to the circuit 106 by the circuit 108. The circuit 104 may be configured to communicate with the circuit 106 via a plurality of data signals (e.g., DQ), a plurality of data mask signals (e.g., DM) and a plurality of data strobe signals (e.g., DQS). The circuit 104 may be further configured to generate address signals (e.g., A0 . . . A12), command signals (e.g., CAS, RAS, WE, CS, etc.) and differential clock signals (e.g., CK/CK#).

In one example, the circuits 102, 104 and 108 may be implemented (or instantiated) on an application specific integrated circuit (ASIC) 110. However, the circuit 102 may be implemented separately and mounted on a common printed circuit board (PCB) along with the circuits 104, 106 and 108. The ASIC 110 may be implemented, in one example, as a platform (or structured) ASIC. The ASIC 110 may further comprise one or more structures selected from the group consisting of (i) high-speed standards-compliant serializer/deserializer (SERDES), (ii) high-performance processors and associated systems and reference designs, (iii) digital signal processing (DSP) cores, (iv) processor peripherals, (v) on-chip bus structures (e.g., AMBA, etc.), (vi) universal serial bus (USB) cores, (vii) memory cores and controllers, (viii) ethernet media access controller (MAC) and physical (PHY) cores and (ix)various protocol layer IP (e.g., PCI, Express, XGXS, SPI4-2, etc.). The ASIC 110 may provide solutions for complex system on a chip (SoC) designs with reduced risk and turn-around times.

Figure 2:
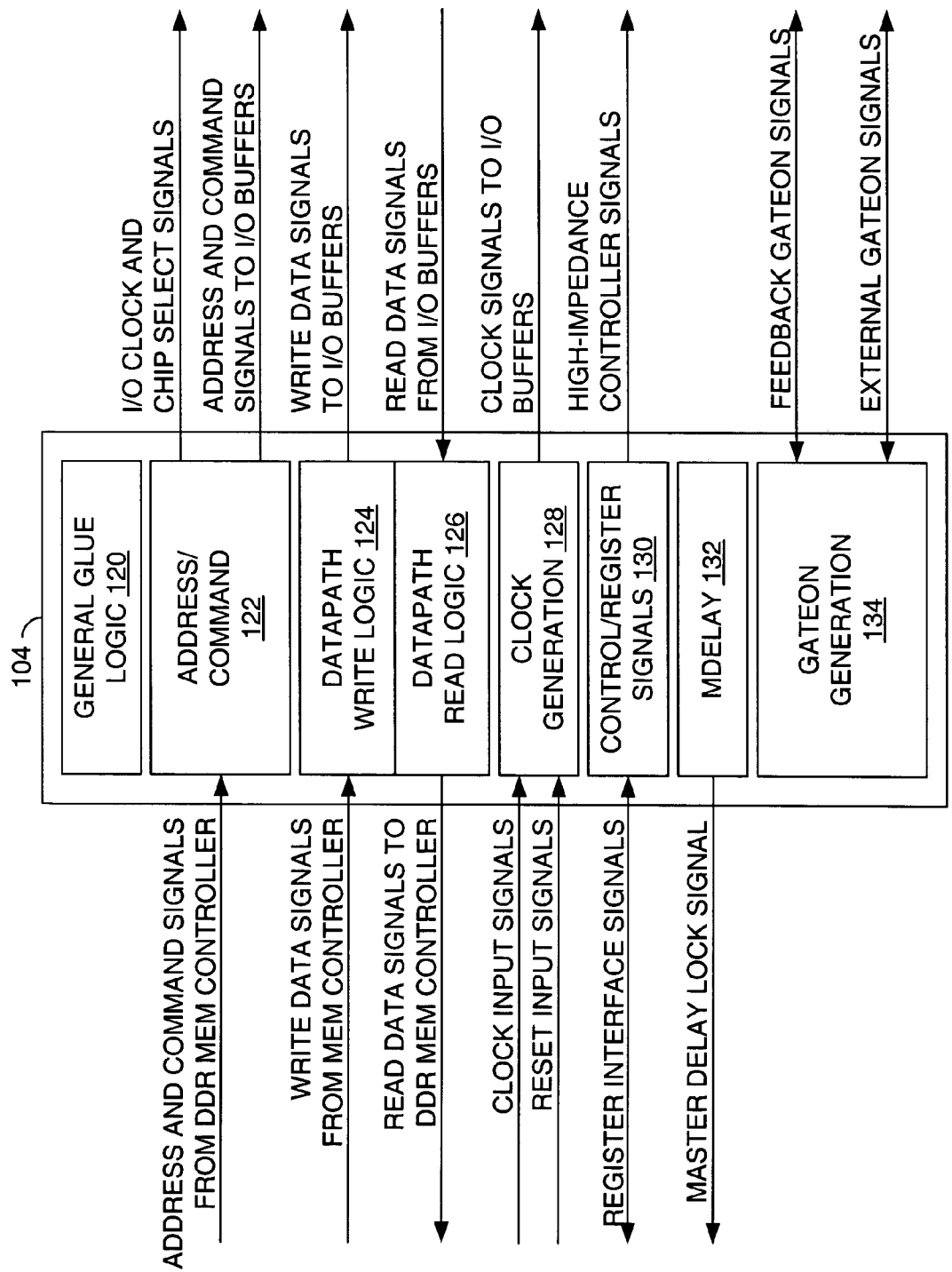
FIG. 2 is a block diagram illustrating an example of a DDR PHY 104 of FIG. 1 in accordance with a preferred embodiment of the present invention.

Referring to FIG. 2, a more detailed block diagram of the circuit 104 is shown. In one example, the circuit 104 may comprise a block (or circuit) 120, a block (or circuit) 122, a block (or circuit) 124, a block (or circuit) 126, a block (or circuit) 128, a block (or circuit) 130, a block (or circuit) 132, and a block (or circuit) 134. The block 120 may be implemented as a soft logic block. The block 120 may provide general glue logic for the entire DDR PHY 104. The block 122 may be implemented with a set of hardmacros dedicated to address and command functions. As used herein, the term hardmacros generally refers to core elements with known performance characteristics and laid out in fixed areas. The block 124 may be implemented as a set of hardmacros for a write data path and write data signals. The block 126 may be implemented with a set of hardmacros for a read data path and read data signals. In one example, the blocks 124 and 126 may implemented as single (e.g., both read and write) datapath hardmacros.

The block 128 may be implemented with soft logic. The block 128 may comprise clock enable and reset circuitry. In one example, clock input signals and reset input signals may be routed to the block 128. In one example, the block 128 may be configured to generate clock enable signals for the blocks 124 and 126. The block 130 may be implemented as soft logic. In one example, the block 130 may be configured to define one or more control and register signals. The block 130 may be configured to receive and present register interface signals. In one example, the block 130 may be further configured to generate impedance controller signals.

The block 132 may be implemented with a master delay hardmacro. The block 134 may be implemented as part of the datapath hardmacros of the blocks 124 and 126. The block 134 may comprise a programmable GATEON functionality, a feedback GATEON functionality and an external GATEON functionality. The feedback GATEON functionality and the external GATEON functionality may be optional features. In one example, the feedback GATEON functionality and the external GATEON functionality may be selected through programmable registers and may use dedicated IO pins.

The circuit 104 generally provides a complete physical interface (PHY) core that may be implemented between a double data rate (DDR) memory controller (which may be implemented on the ASIC 110 or as an external device) and external memory devices. The circuit 104 may be configured using compile options. The circuit 104 may support different data bus widths (e.g., from 8 bits to 144 bits in byte increments) and address command bus widths (e.g., up to 33 bits).

In one example, the circuit 104 may be configured to support clock speeds up to 200 MHz/400 Mbps (point-to-point DDR SDRAM configuration), for high data bandwidth applications. In another example, the circuit 104 may be configured to support clock speeds up to 166 MHz/333 Mbps (multi-drop DDR SDRAM configuration) for wide data bus, high-capacity applications. The circuit 104 may support differential clock signals (e.g., CK/CKN). The circuit 104 may include a fully synchronous 1x clock interface to the memory controller 102. The circuit 104 may provide registers to control the master delay hardmacro 132, the datapath hardmacros comprising the write datapath logic 124 and the read datapath logic 126 and the address/command (ADRS) hardmacros 122. The circuit 104 may be configured to synchronize read data from DDR read clock domain to the 1x clock domain and write data from the 1x clock domain to the DDR write clock domain.

The circuit 104 may include programmable features that may accommodate different column address strobe (CAS) latencies, burst lengths, datapath widths, and varying propagation delays. For example, the circuit 104 may (i) support x4, x8 and x16 types of DDR memory devices and (ii) support burst lengths of 2, 4 or 8.

In general, configuration options for the circuit 104 may be provided at two levels: compile time options and programmable options. Examples of configuration objects that may be set prior to compiling a register transfer level (RTL) code representation of the circuit 104 may be summarized as in the following TABLE 1:

TABLE 1

| Compile-Time Option | Option Description |
| --- | --- |
| DQ (data) bus width | From 8 bits to 144 bits in 8-bit increments |
| Number of Chip Selects | From 1 to 8 chip selects (CSn) |
| Number of clock enable signals | Either 1 CKE signal or 1 per CSn |
| Address Width | Selectable 12, 13, or 14 address bits |
| Feedback GATEON delay signals | For implementing GATEON delay with dummy loads on the PCB. If this option is not selected, the relevant core I/O signals are removed. |
| External GATEON delay | For implementing GATEON delay with logic on the PCB. If this option is not selected, the relevant core I/O signals are removed. |

The options listed in TABLE 1 are generally not programmable after compiling the circuit 104.

The circuit 104 generally includes a variety of programmable options. In one example, the options may be loaded and managed via programmable control registers. In one example, the programmable control registers may be implemented to control (i) datapath (DP) hardmacro options (e.g., slave delay load, update and bypass), (ii) master delay (MDELAY) control (e.g., for one-fourth or one-fifth cycle delay tracking over the range of process voltage and temperature), (iii) address/command (ADRS) for control of signal propagation on address lines (e.g., using a programmable address clock delay), (iv) a programmable data strobe gating (e.g., read data strobe GATEON delay) that may be used for gating DQS during read cycles, (v) a feedback read data strobe GATEON delay that may be used as an alternative to the programmable GATEON delay (e.g., using external delay matching on a circuit board), (vi) signal propagation delay. (or skew) control through the datapaths (e.g., using adjustable delays on the read data strobe and write data mask strobe) and (vii) physical core system information, such as GATEON delay settings and read data strobe delay settings. Examples of control registers that may be implemented are summarized in the following TABLE 2:

TABLE 2

| Register Name | Access | Reset State |
|---|---|---|
| PHY Misc Control | RD/WR | 0x0000_1000 |
| PHY Impedance Controller | Rd/Wr | 0x0000_0000 |
| PHY FIFO 1 | Read Only | 0x0000_0000 |
| PHY FIFO 2 | Read Only | 0x0000_0000 |
| PHY FIFO 3 | Read Only | 0x0000_0000 |
| Reserved | | |
| Read Gate Pattern | Rd/Wr | 0x0000_0000 |
| Reserved | | |
| DW DQS Clk Skew 1 | Rd/Wr | 0x0000_0000 |
| DW DQS Clk Skew 2 | Rd/Wr | 0x0000_0000 |
| DW DM Clk Skew 1 | Rd/Wr | 0x0000_0000 |
| DW DM Clk Skew 2 | Rd/Wr | 0x0000_0000 |
| Reserved | | |
| GATEON Delay DP 1, 0 | Rd/Wr | 0x0000_0000 |
| GATEON Delay DP 3, 2 | Rd/Wr | 0x0000_0000 |
| GATEON Delay DP 5, 4 | Rd/Wr | 0x0000_0000 |
| GATEON Delay DP 7, 6 | Rd/Wr | 0x0000_0000 |
| GATEON Delay DP 9, 8 | Rd/Wr | 0x0000_0000 |
| GATEON Delay DP 11, 10 | Rd/Wr | 0x0000_0000 |
| GATEON Delay DP 13, 12 | Rd/Wr | 0x0000_0000 |
| GATEON Delay DP 15, 14 | Rd/Wr | 0x0000_0000 |
| GATEON delay DP 17, 16 | Rd/Wr | 0x0000_0000 |
| Reserved | | |
| FB GATEON Delay | Rd/Wr | 0x0000_0000 |
| MDELAY0 Controls | Rd/Wr | 0x003E_0019 |
| MDELAY0 Info | Read Only | 0x0000_0000 |
| Reserved | | |
| MDELAY1 Controls | Rd/Wr | 0x003E_0019 |
| MDELAY1 Info | Read Only | 0x0000_0000 |
| Reserved | | |
| PHY Select Slave Delay | Rd/Wr | 0x0000_0000 |
| PHY Read Slave Delays | Read Only | 0x0000_0000 |
| Reserved | | |
| DDR PHY Compile 2 | Read Only | Varies |
| DDR PHY Compile 1 | Read Only | Varies |
| DDR PHY System Code | Read Only | 0x8000_0000 |
| DDR PHY Module Version | Read Only | 0x8000_VVVV |
| DDR PHY Module Code | Read Only | 0x8000_0001 |

In one example, the circuit 104 may be implemented based on diffused datapath (DP) and master delay (MDELAY) modules implemented in 0.18 micron technology. In another example, the circuit 104 may be implemented based on R-cell datapath and master delay modules implemented in 0.11 micron technology. For example, the circuit 104 may be implemented in an R-cell transistor fabric of the ASIC 110. As used herein, R-cell generally refers to an area of silicon containing one or more diffusions for forming the parts of N and/or P type transistors and the contact points where wires (e.g., metal layers) may be attached in subsequent manufacturing steps (e.g., to power, ground, inputs and outputs). Wire layers may be added to the R-cell transistor fabric to make particular transistors, logic gates, soft IP blocks, firm IP blocks and/or storage elements.

The circuit 104 may be implemented, in one example, as a complete set of design deliverables. For example, the set of deliverables may include, but is not limited to, register transfer level (RTL) code, netlist, synthesis and timing scripts, layout guidelines, technical manual, application notes and/or a verification environment for fast cycle-accurate behavioral simulations. In general, top-level modules of the circuit 104 may integrate address, datapath, and master delay circuitry. The elements may be designed as hardmacros (or hard IP) or soft IP with pre-verified functionality, layout and timing closure. The master delay hardmacro may be configured to subdivide the clock period using precise analog delay elements.

The datapath (DP) hardmacro may be configured to manipulate the data strobe signal DQS from/to the memory 106 and facilitate data capture in capture latches. The address/command hardmacro generally provides an interface to drive address and command buses of the memory 106.

When integrating the block (or core) 104 in a platform/structured application specific integrated circuit (ASIC), the external SDRAM devices 106 are generally taken into account. For example, consideration is generally given to: a data width of the memory devices, a read data burst length (BL), and CAS Latency (CL). For example, the circuit 104 may support four-bit (x4) and 8-bit (x8, x16) types of memory devices and/or burst lengths of 2, 4, and 8. The term CAS Latency (CL) generally refers to a read access time of the memory devices 106 (e.g., expressed in units of clock cycles). For example, if CL=2, the CAS latency is equal to two periods of a clock signal.

The circuit 104 may have two clock inputs that may receive a first clock signal (e.g., CLK_1X) and a second clock signal (e.g., CLK_2X), respectively. The signal CLK_1X may be implemented as a single-rate clock. The signal CLK_2X may be implemented as a double-rate clock. The signal CLK_2X may feed the hardmacros and other circuits within the circuit 104. The circuit 104 is implemented with IO buffers 108 for all signals going to and coming from the external DDR memory devices 106. In one example, the IO buffers 108 may have a staging flip-flop in the output path. Each of the output signals going to the external DDR memory 106 (e.g., data, address, and command) generally have a corresponding strobe (e.g., CLK2X_<signalname>) that may be presented to a CP input pin of the IO buffers 108. In general, a corresponding strobe may be implemented for every signal.

In one example, the circuit 104 may have three reset inputs that may receive three respective signals (e.g., RSTN_1X, RSTN_2X, and R_RESET_N). The signals RSTN_1X and RSTN_2X may be configured to reset the core logic, excluding the internal control registers described below in connection with FIGS. 9-23. The signals RSTN_1X and RSTN_2X may be synchronous to clock signals CLK_1X and CLK_2X, respectively. The signal R_RESET_N may be configured to reset the internal control registers of the circuit 104. In one example, the three reset input signals may be configured to preserve the register settings during a core reset. In another example, the signal R_RESET_N may be tied to the signal RSTN_1X to provide a full reset. The signal RSTN_1X is generally synchronous with respect to a rising edge of the signal CLK_1X. The signal RSTN_2X is generally synchronous with respect to a rising edge of the signal CLK_2X.

Figure 3:
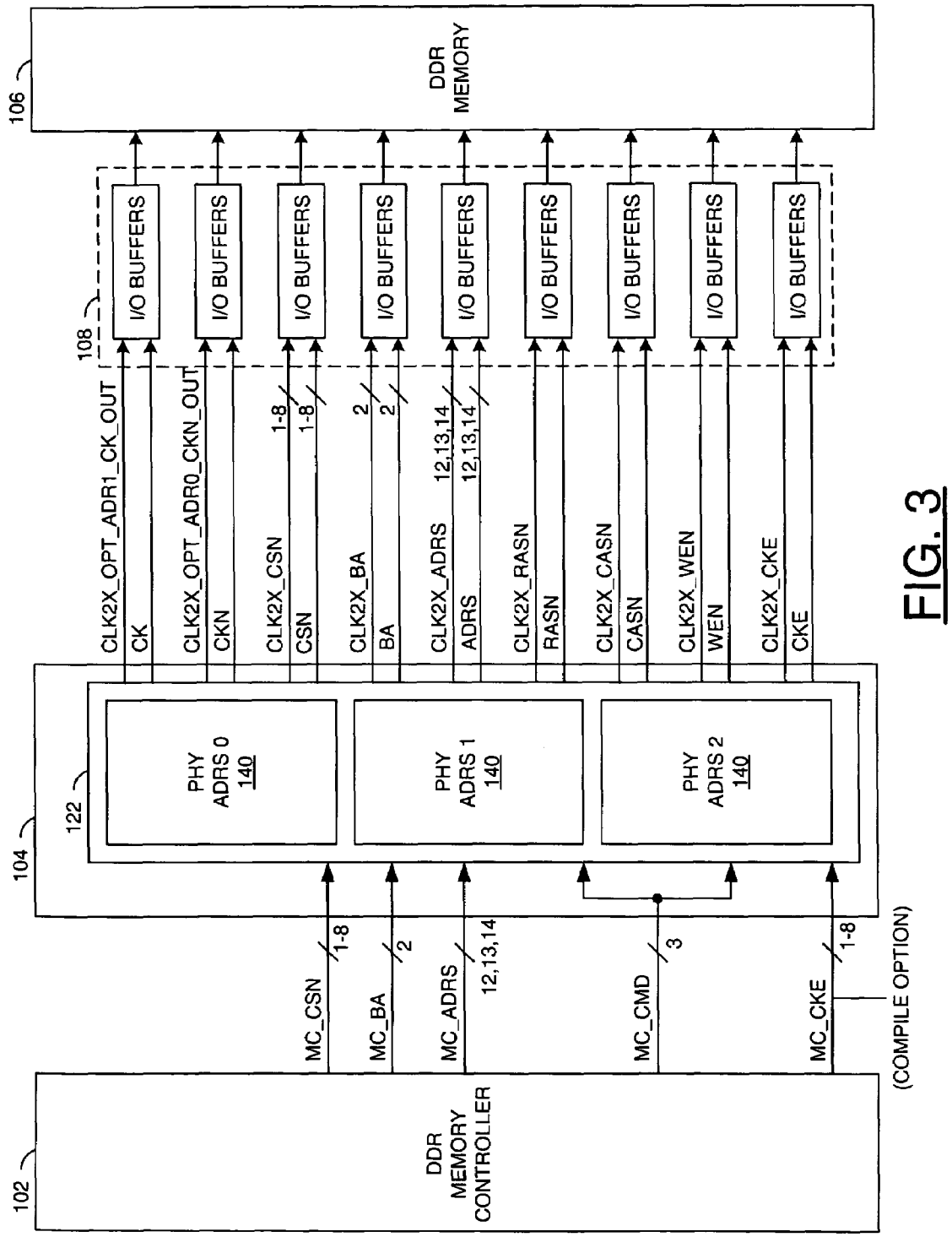
FIG. 3 is a block diagram illustrating an example address/command block 120 of the DDR PHY 104 of FIG. 2.

Referring to FIG. 3, a more detailed block diagram is shown illustrating an example address and control (ADRS) block 122 of the circuit 104. The ADRS block 122 may comprise a plurality of hardmacros 140 that may be configured to present a number of outputs to the IO buffers 108 in response to control, command and address signals received from the memory controller 102. Each of the outputs may have a corresponding clock signal. In general, the clocks for the IO buffers that drive the address lines, RAS, CAS, BA, and so forth, are generated within the circuit 104 by the ADRS hardmacros. In one example, the connections between the ADRS hardmacros and the IO buffers 108 may be automatically routed.

In one example, the circuit 104 may be implemented with either 12, 13, or 14 address lines. The circuit 104 may be configured to support memory technologies from 64 Mb to 1 Gb. In one example, the signals CK and CKn (e.g., a differential clock pair) may be provided by a clock factory (e.g., an element of the platform ASIC 110 configured to generate clocks). In one example, two bits of the ADRS hardmacro may be configurable as either a CK/CKn signal or as an Address/Command signal. Functional timing of the ADRS hardmacro is described in more detail below in connection with FIG. 10.

Figure 4:
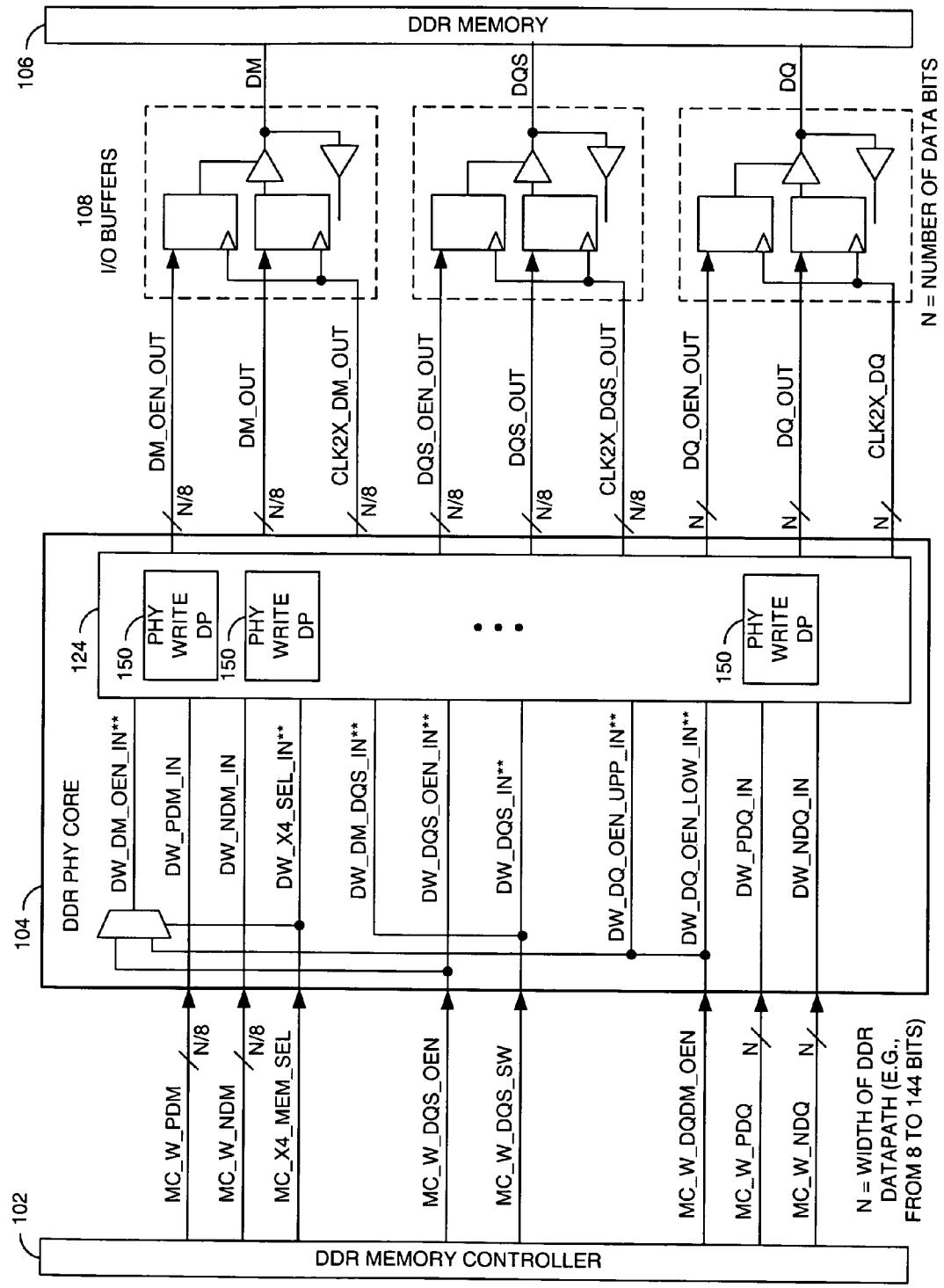
FIG. 4 is a block diagram illustrating a write data logic and signal paths 124 for the DDR PHY 104 of FIG. 2.

Referring to FIG. 4, a more detailed block diagram is shown illustrating a write data logic block 124 of the circuit 104. The write data logic block 124 may comprise a number of datapath (DP) hardmacros 150. Each of the datapath hardmacros 150 may be configured to receive a number of signals from the memory controller 102 and present a number of signals to the DDR SDRAM 106 via the IO buffers 108. The signals marked with ** are generally fanned out to each datapath. Logic is generally included in the circuit 104 to provide support for x4, x8, and x16 DDR memory devices. The logic may be implemented as part of the datapath hardmacros. The logic may be implemented using conventional techniques.

The circuit 104 may have a number of outputs that may present a number of write data signals to the IO buffers 108. Each of the outputs may have a corresponding clock signal. In general, the clocks for the IO buffers that drive the signals DQ, DM and DQS are generated within the circuit 104. In one example, the connections between the clock outputs of the circuit 104 to the IO clock inputs of the IO buffers 108 may be automatically routed. A more detailed description of the functional timing of the write logic may be found below in connection with FIGS. 12-17.

Figure 5:
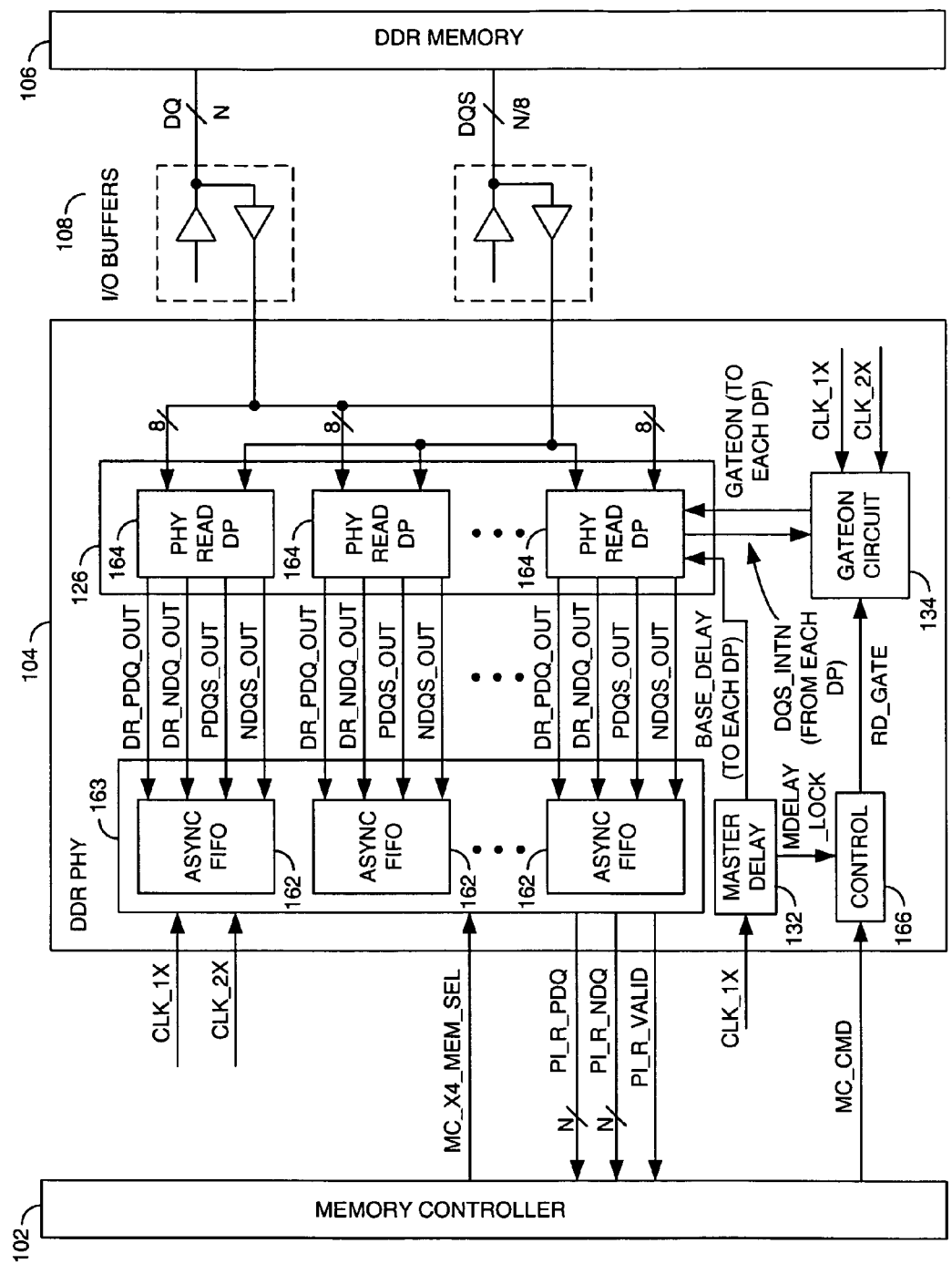
FIG. 5 is a more detailed block diagram illustrating a read data logic and signal paths 126 of the DDR PHY of FIG. 2.

Referring to FIG. 5, a more detailed block diagram is shown illustrating example read data logic and signal paths of the circuit 104 in which a preferred embodiment of the present invention may be implemented. In one example, the circuit 104 may further comprise a number of asynchronous (ASYNC) first-in first-out (FIFO) buffers 162 and a FIFO synchronization logic 163. The read datapath 126 may be implemented as a number of physical read datapaths 164. Each of the physical read datapaths 164 may be configured to receive (i) a respective portion of the read data signals DQ from the DDR memory 106, (ii) a respective read data strobe signal or signals DQS associated with the respective portion of the received read data signals and (iii) a gating signal (e.g., GATEON) from the GATEON generation block 134. Each of the physical read datapaths 164 may communicate with a corresponding one of the asynchronous FIFOs 162 via a number of signals (e.g., DR_PDQ_OUT, DR_NDQ_OUT, PDQS_OUT, and NDQS_OUT). In one example, separate signals (e.g., PDQS_OUT_UN, NDQS_OUT_UN, PDQS_OUT_LN, and NDQS_OUT_LN) may be generated for each nibble of the datapaths 164. In one example, the asynchronous FIFOs 162 may be configured to interface the physical read datapaths 164 with the memory controller 102.

In general, the signals DQ and DQS may be presented to the circuit 104 on a number of buses. The signals DQ and DQS may be broken out to multiple instantiations of DP hardmacros. The DPs may be configured via internal settings to delay the read data strobe signals DQS based on one or more control signals (or values) from the MDELAY circuit 132. Each of the physical read datapaths 164 may be configured to present the DQ data to a respective asynchronous FIFO 162 via the signals DR_PDQ_OUT and DR_NDQ_OUT, after the data is sampled using the delayed read data strobe signals DQS.

The FIFOs 162 are generally configured to transfer the read data DQ from the read data strobe (or DQS) domain to the CLK_1X domain for presentation to the memory controller 102. The read data DR_PDQ_OUT and DR_NDQ_OUT are generally written to the FIFOs 162 in response to (e.g., clocked by) the signals PDQS_OUT and NDQS_OUT, respectively). The memory controller 102 may be configured to read the data DQ (e.g., via signals PI_R_PDQ and PI_R_NDQ) from the FIFOs 162 in response to the clock signal CLK_1X. In one example, the FIFOs 162 may be implemented as eight words deep. The read FIFO synchronization logic 163 may be configured to control the discrete read FIFOs 162. The read FIFO. synchronization logic 163 may be configured to interlock each read FIFO, align the read data words and present the aligned read data words to the memory controller 102 clock domain.

As briefly described above, the physical read datapaths 164 are generally programmable from when the data/strobe pairs DQ/DQS are received at the input to the circuit 104, to sampling the read data with the read data strobe signal DQS, and passing the data to the memory controller 102. The programmability of the physical read datapaths 164 generally provides flexibility for handling different column address strobe (CAS) latencies, burst lengths, device process variation, and/or propagation delays.

The master delay (MDELAY) logic 132 is generally configured to calculate a delay value for generating a one-quarter cycle or one-fifth cycle delay with respect to the device reference clock (e.g., the signal CLK_1X). The calculated delay is generally used by the physical read datapaths 164 to center a read data capture clock (e.g., the signal DQS) in a valid DDR device read data window. The calculated delay generally tracks process, voltage and temperature (PVT) corners for reliable read data latching. The MDELAY logic 132 may be configured to generate the one-quarter cycle or one-fifth cycle delay using a delay lock loop (DLL). Once the DLL is locked to the clock signal CLK_1X, a signal (e.g., MDELAY_LOCK) may be generated indicating the locked state. The signal MDELAY_LOCK may be presented to an input of a control logic circuit (or block) 166 and/or the memory controller 102.

The MDELAY logic 132 may be configured to generate one or more control signals (or values) for transferring the delay settings (or values) to one or more slave delay cells (describe in more detail in connection with FIGS. 3A and 3B) in each of the physical read datapaths 164. The delay values, when transferred to each of the physical read datapaths 164, are generally referred to as base delays. In one example, a base delay may be implemented for each nibble of each DP byte. For example, a first base delay value (e.g., BASE_DELAY_UN) may be implemented for each upper nibble and a second base delay value (e.g., BASE_DELAY_LN) may be implemented for each lower nibble. The physical read datapaths 164 may also be programmed with offset delay values corresponding to each nibble (e.g., OFFSET_P_UN, OFFSET_N_UN, OFFSET_P_LN and OFFSET_N_LN). In one example, each of the physical read datapaths 164 may have a set of base delays that are independent of the other physical read datapaths 164. The offset delay values may be added to or subtracted from the respective base delay values.

The control circuit 166 may be configured to generate one or more control signals for controlling and/or configuring the FIFOs 162 and physical read datapaths 164. In one example, the control circuit 166 may be configured to generate a gating signal (e.g., RD_GATE) in response to a signal (e.g., MC_CMD) received from the controller 102. In one example, the circuit 166 may be configured to generate the signal RD_GATE in response to decoding a READ command in the signal MC_CMD. The signal RD_GATE is generally configured to prevent invalid states (e.g., when DQS is in a 3-state, or OFF, mode) from entering the circuit 163. The signal RD_GATE may be used to generate one or more gating signals.

The GATEON generation block 134 may comprise a programmable GATEON generating circuit. The circuit 134 may be configured to generate the signal GATEON in response to the signal RD_GATE, a first clock signal (e.g., CLK_1X), a second clock signal (e.g., CLK_2X) and a data strobe signal (e.g., DQS_INTN) received from the physical read datapaths 164. The signal GATEON may be used to gate the read data strobe signal DQS received from the memory device 106. In one example, separate gating signals (e.g., GATEON_UN, GATEON_LN, etc.) may be generated for each nibble of the physical read datapaths 164. The signal DQS_INTN may be used to de-assert the signal GATEON. In one example, separate signals (e.g., DQS_INTN_UN and DQS_INTN_LN) may be generated for each nibble of the physical read datapaths 164. Although the circuit 134 is shown implemented separately from the physical read datapaths 164, it will be understood by those skilled in the art that the circuit 134 may be implemented as part of the physical read datapaths 164 (e.g., the signal GATEON may be generated within the physical read datapaths 164 or external to the physical read datapaths 164).

Figure 6A:
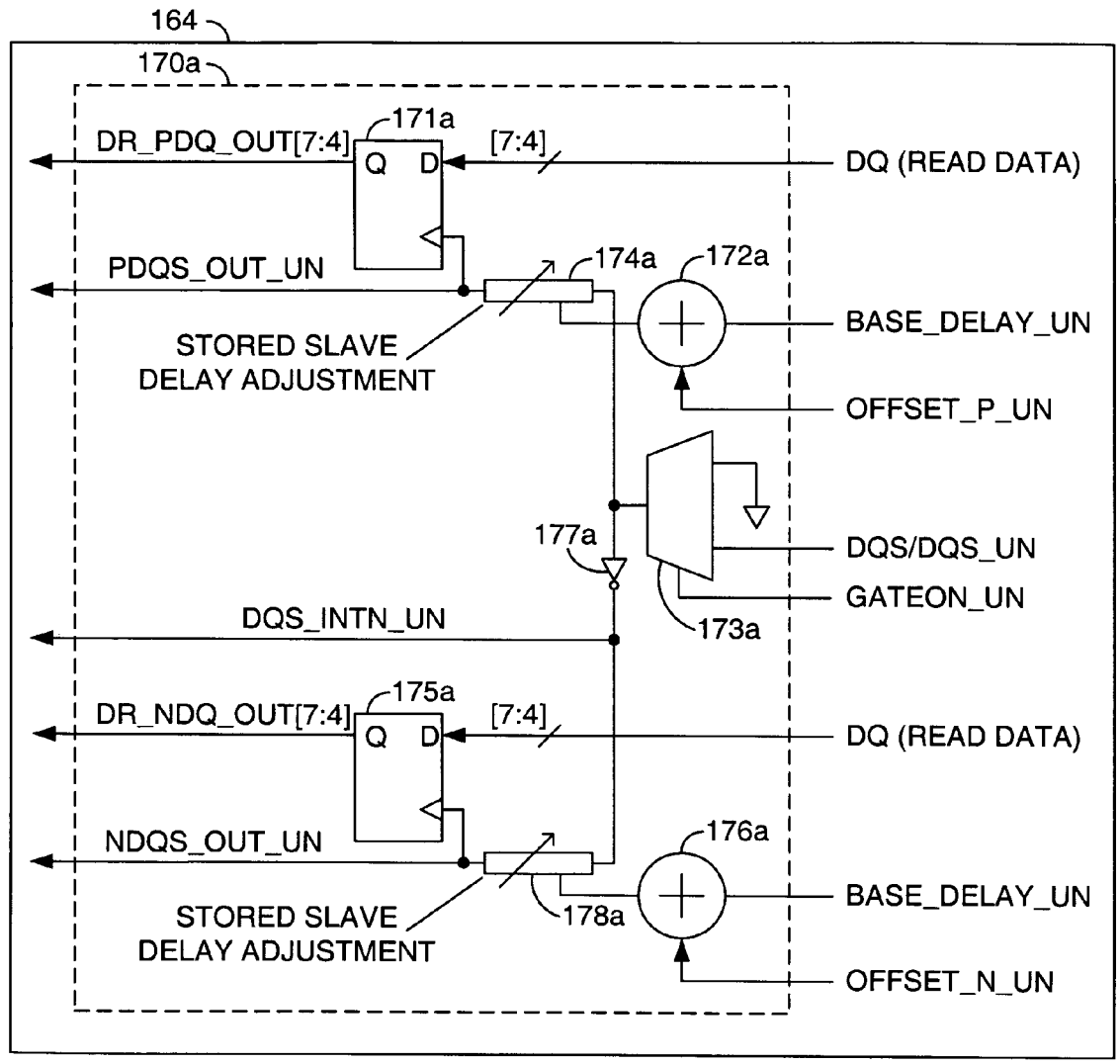
FIGS. 6 (A-B) are more detailed block diagrams illustrating details of read data latching and gating logic.
Figure 6B:
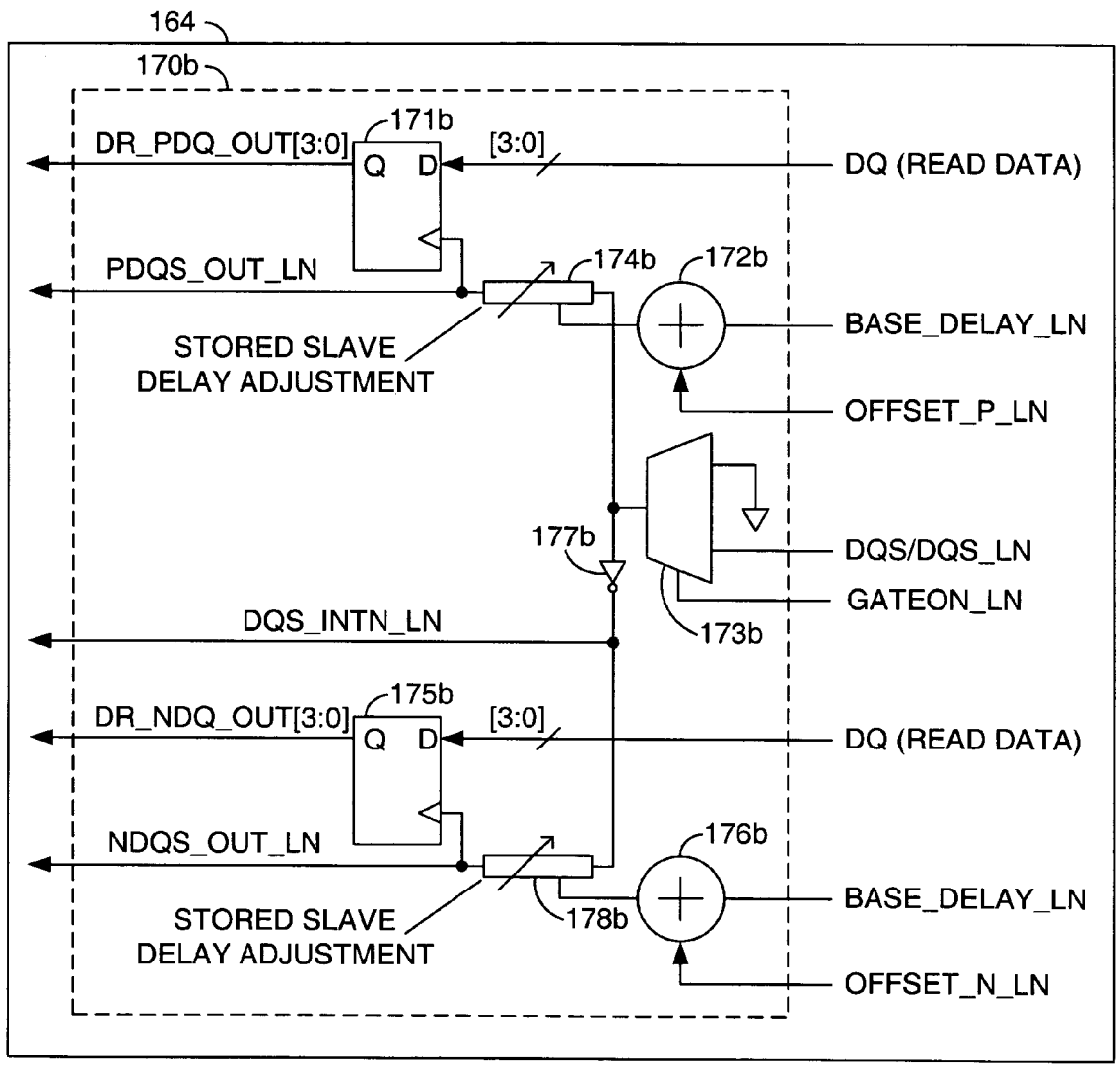

Referring to FIGS. 6 (A-B), more detailed block diagrams of a physical read datapaths 164 of FIG. 2 are shown illustrating an example read data latching and gating circuit in accordance with a preferred embodiment of the present invention. In one example, each physical read datapaths 164 may comprise an upper nibble pathway 170a (FIG. 6A) and a lower nibble pathway 170b (FIG. 6B). The upper nibble pathway 170a may have a first input that may receive a number of bits of the signal DQ (e.g., bits 7:4), a second input that may receive the signal BASE_DELAY_UN, a third input that may receive the signal OFFSET_P_UN, a fourth input that may receive the signal OFFSET_N_UN, a fifth input that may receive the signal DQS (or the signal DQS UN in the x4 mode), a sixth input that may receive a signal (e.g., GATEON_UN). The upper nibble pathway 170a may also have a first output that may present a number of bits (e.g., the signal DR_PDQ_OUT[7:4]), a second output that may present a number of bits (e.g., the signal DR_NDQ_OUT[7:4]), a third output that may present a signal (e.g., PDQS_OUT_UN), a fourth output that may present a signal (e.g., NDQS_OUT_UN)'and a fifth output that may present a signal (e.g., DQS_INTN_UN).

The upper nibble pathway 170a may comprise a circuit (or block) 171a, a circuit (or block) 172a, a circuit (or block) 173a, a circuit (or block) 174a, a circuit (or block) 175a, a circuit (or block) 176a, a circuit (or block) 177a and a circuit (or block) 178a. The circuit 171a may be implemented as one or more registers. The circuit 172a may be implemented as an adder block. The circuit 173a may be implemented as a multiplexer circuit. The circuit 174a may be implemented as a slave delay adjustment block. The circuit 175a may be implemented as one or more registers. The circuit 176a may be implemented as an adder block. The circuit 177a may be implemented as an inverter circuit. The circuit 178a may be implemented as a slave delay adjustment block.

The circuit 171a may be configured to latch an upper nibble (e.g., bits 7:4) of the read data signal DQ in response to a clock input. The circuit 171a may be further configured to present the latched read data as the signal DR_PDQ_OUT[7:4]. The circuit 172a may be configured to generate a sum (or difference) of the signals BASE_DELAY_UN and OFFSET_P_UN. The circuit 173a may be configured to select either the signal DQS (or the signal DQS UN in the x4 mode) or a predetermined logic level (e.g., a LOW or logic 0) in response to the signal GATEON_UN. The_circuit 174a may be configured to delay the signal presented by the circuit 173a based on the sum (or difference) generated by the circuit 172a . An output of the circuit 174a may present the signal PDQS_OUT_UN to the clock input of the circuit 171a and the third output of the upper nibble pathway 170a.

The circuit 175a may be configured to latch an upper nibble (e.g., bits 7:4) of the read data signal DQ in response to a clock input. The circuit 175a may be further configured to present the latched read data as the signal DR_NDQ_OUT[7:4]. The circuit 176a may be configured to generate a sum (or difference) of the signals BASE_DELAY_UN and OFFSET_N_UN. The circuit 177a may be configured to generate the signal DQS_INTN_UN as a digital complement of the signal presented by the circuit 173a . The signal DQS_INTN_UN_may be presented to an input of the circuit 178a and the fifth output of the upper nibble pathway 170a . The circuit 178a may be configured to generate the signal NDQS_OUT_UN by delaying the signal DQS_INTN_N based on the sum (or difference) generated by the circuit 176a . An output of the circuit 178a may present the signal NDQS_OUT_UN to the clock input of the circuit 175a and the fourth output of the upper nibble pathway 170a.

The lower nibble pathway 170b may have a first input that may receive a number of bits (e.g., bits 3:0) of the signal DQ, a second input that may receive the signal BASE_DELAY_LN, a third input that may receive the signal OFFSET_P_LN, a fourth input that may receive the signal OFFSET_N_LN, a fifth input that may receive the signal DQS (or the signal DQS_LN in the x4 mode), a sixth input that may receive a signal (e.g., GATEON_LN). The lower nibble pathway 170b may also have a first output that may present a number of bits (e.g., the signal DR_PDQ_OUT[3:0]), a second output that may present a number of bits (e.g., the signal DR_NDQ_UT[3:0]), a third output that may present the signal PDQS_OUT_LN, a fourth output that may present the signal NDQS_OUT_LN and a fifth output that may present the signal DQS_INTN_LN.

The lower nibble pathway 170b may comprise a circuit (or block) 171b , a circuit (or block) 172b , a circuit (or block) 173b , a circuit (or block) 174b , a circuit (or block) 175b , a circuit (or block) 176b , a circuit (or block) 177b and a circuit (or block) 178b . The circuit 171b may be implemented as one or more registers. The circuit 172b may be implemented as an adder block. The circuit 173b may be implemented as a multiplexer circuit. The circuit 174b may be implemented as a slave delay adjustment block. The circuit 175b may be implemented as one or more registers. The circuit 176b may be implemented as an adder block. The circuit 177b may be implemented as an inverter circuit. The circuit 178b may be implemented as a slave delay adjustment block.

The circuit 171b may be configured to latch a lower nibble (e.g., bits 3:0) of the read data signal DQ in response to a clock input. The circuit 171b may be further configured to present the latched read data as the signal DR_PDQ_UT[3:0]. The circuit 172b may be configured to generate a sum (or difference) of the signals BASE_DELAY_LN and OFFSET_P_LN. The circuit 173b may be configured to select either the signal DQS (or the signal DQS_LN in the x1 mode) or a predetermined logic level (e.g., a LOW or logic 0) in response to the signal GATEON_LN. The circuit 174b may be configured to delay the signal presented by the circuit 173b based on the sum (or difference) generated by the circuit 172b . An output of the circuit 174b may present the signal PDQS_OUT_LN to the clock input of the circuit 171b and the third output of the lower nibble pathway 170b.

The circuit 175b may be configured to latch a lower nibble (e.g., bits 3:0) of the read data signal DQ in response to a clock input. The circuit 175b may be further configured to present the latched read data as the signal DR_NDQ_OUT[3:0]. The circuit 176b may be configured to generate a sum (or difference) of the signals BASE_DELAY_LN and OFFSET_N_LN. The circuit 177b may be configured to generate the signal DQS_INTN_LN as a digital complement of the signal presented by the circuit 173b. The signal DQS_INTN_LN may be presented to an input of the circuit_178b and the fifth output of the lower nibble pathway 170b. The circuit 178b may be configured to generate the signal NDQS_OUT_LN by delaying the signal DQS_INTN_LN based on the sum (or difference) generated by the circuit 176b. An output of the circuit 178b may present the signal NDQS_OUT_LN to the clock input of the circuit 175b and the fourth output of the lower nibble pathway 170b.

Figure 7:
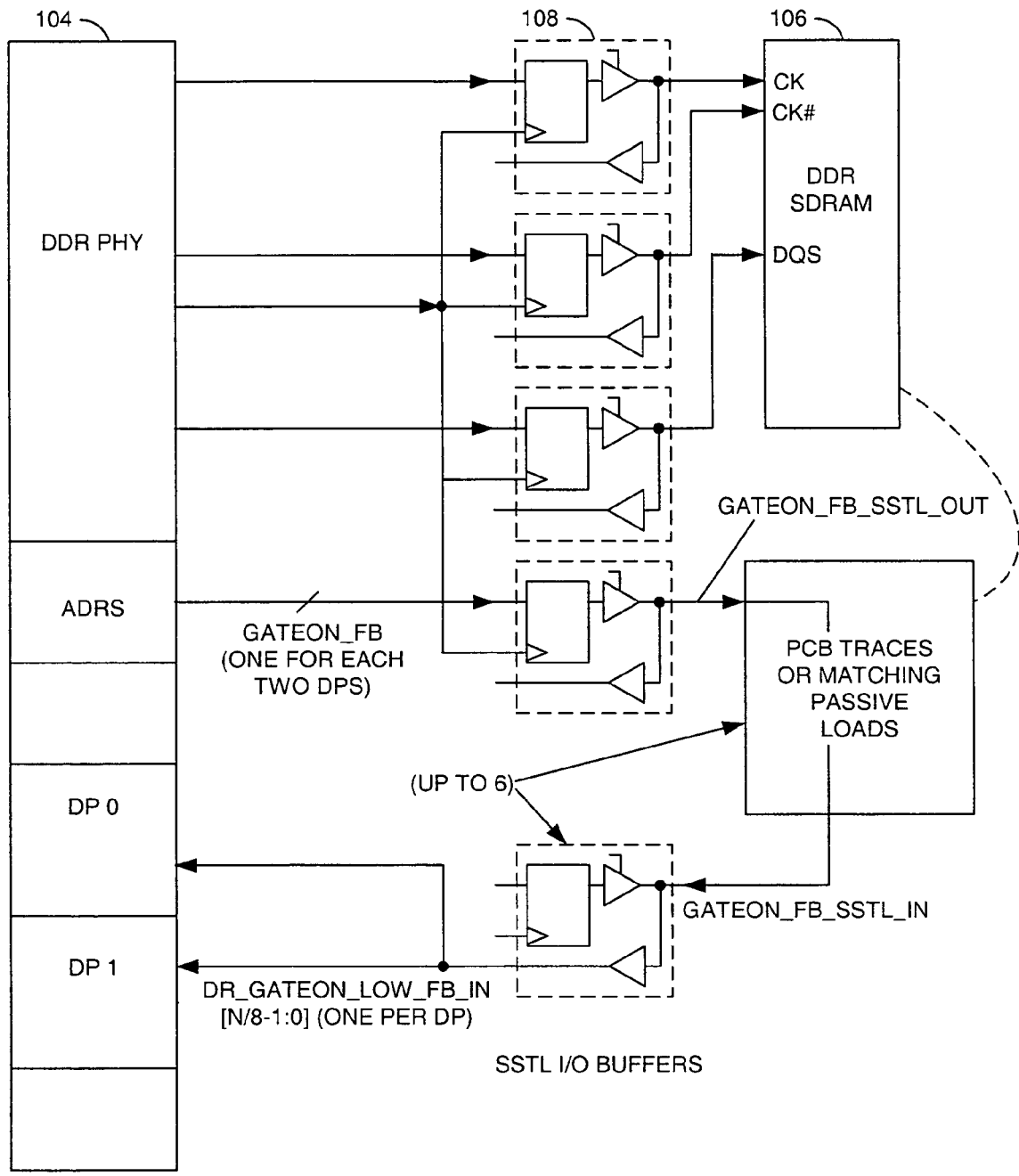
FIG. 7 is a block diagram illustrating a feedback GATEON circuit.

Referring to FIG. 7, a block diagram is shown illustrating a feedback GATEON configuration of the circuit 104. In general, two methods may be implemented together for controlling and adjusting read data timing: GATEON delay adjustments and DQS delay adjustments. GATEON delay generally provides a gating window to port the incoming DQS signal into the logic of the circuit 104. The gating window is configured to be valid only when DQS is being driven by the external memory device, to avoid gating in noise when the SSTL I/O buffers 108 are 3-stated.

There are three methods available for providing the GATEON delay adjustment: programmable GATEON method, feedback GATEON method and external GATEON method. The gating scheme that best fits the particular application is generally selected. The programmable GATEON method generally allows the delay of the GATEON signal to be set through a register interface. In general, one GATEON signal is implemented for each nibble of DQ data. A more detailed description of a programmable GATEON training process can be found in patent application Ser. No. 11/173, 529, filed Jul. 1, 2005, now U.S. Pat. No. 7,215,584, issued May 8, 2007, which is incorporated herein by reference in its entirety.

The feedback GATEON method generally uses a mixture of internal and external circuits to generate the delay. A more detailed description of the feedback GATEON method can be found in co-pending patent application Ser. No. 11/154,401, filed Jun. 16, 2005, which is incorporated herein by reference in its entirety.

The external GATEON method generally uses external hardware. The external GATEON method generally provides a legacy method. The external GATEON method may also be used in applications that specify explicit, low latency gating control/function along the read data paths.

The IO buffers 108 may be implemented as controlled impedance IO buffers. An impedance update logic module may be provided with the buffers 108. The impedance update logic module may be configured to synchronize updates and control when the updates occur. The impedance controller may be implemented external to the circuit 104. However, the circuit 104 may be configured to control the impedance controller as a convenience to the user. The circuit 104 may be configured, in one example, to provide control for the impedance update logic through one or more control registers.

Figure 8:
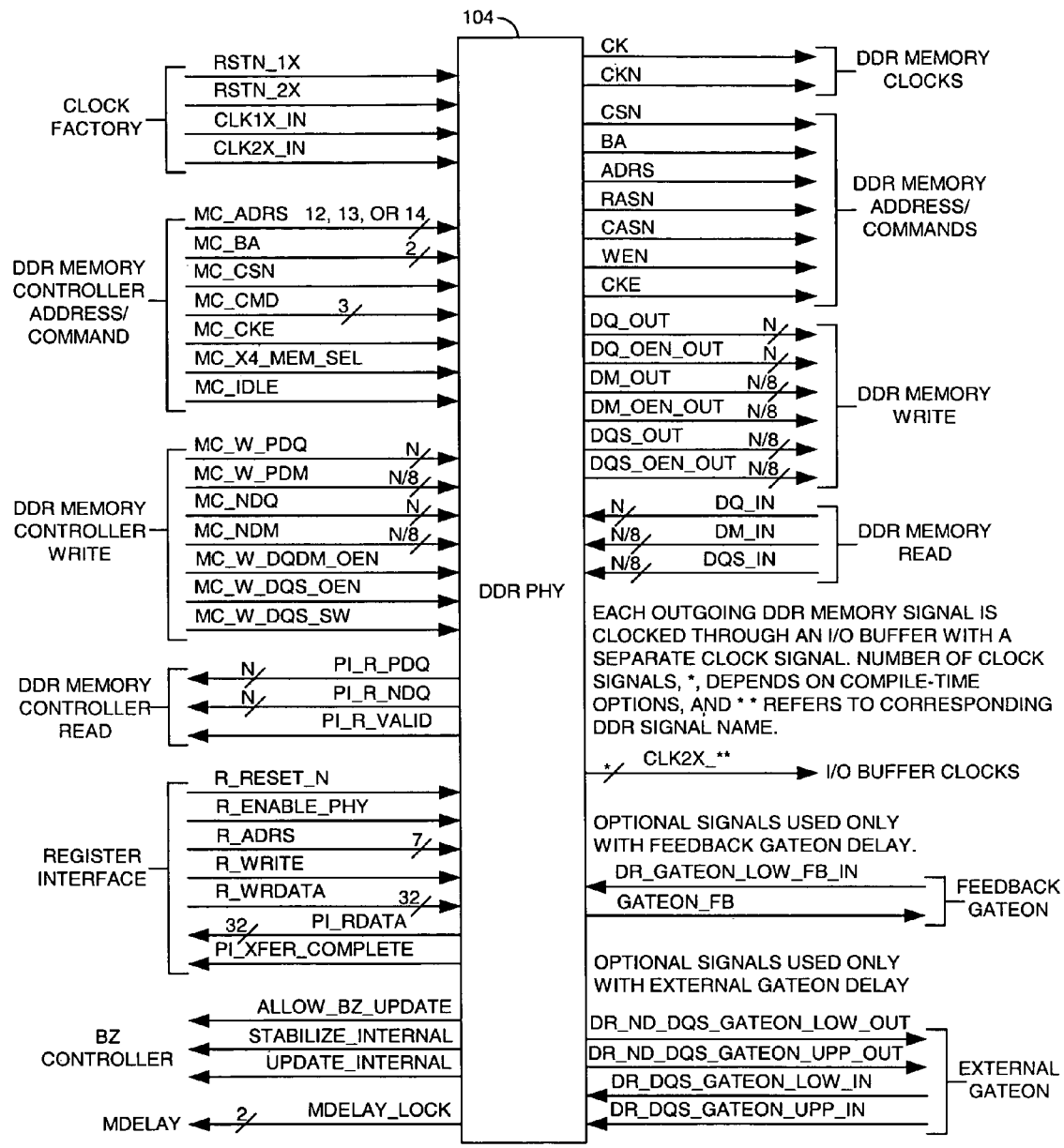
FIG. 8 is a block diagram illustrating various inputs and outputs of the DDR PHY 104 of FIG. 2.

Referring to FIG. 8, a block diagram is shown illustrating various interface signals implemented in the circuit 104 in accordance with a preferred embodiment of the present invention.

Figure 9:
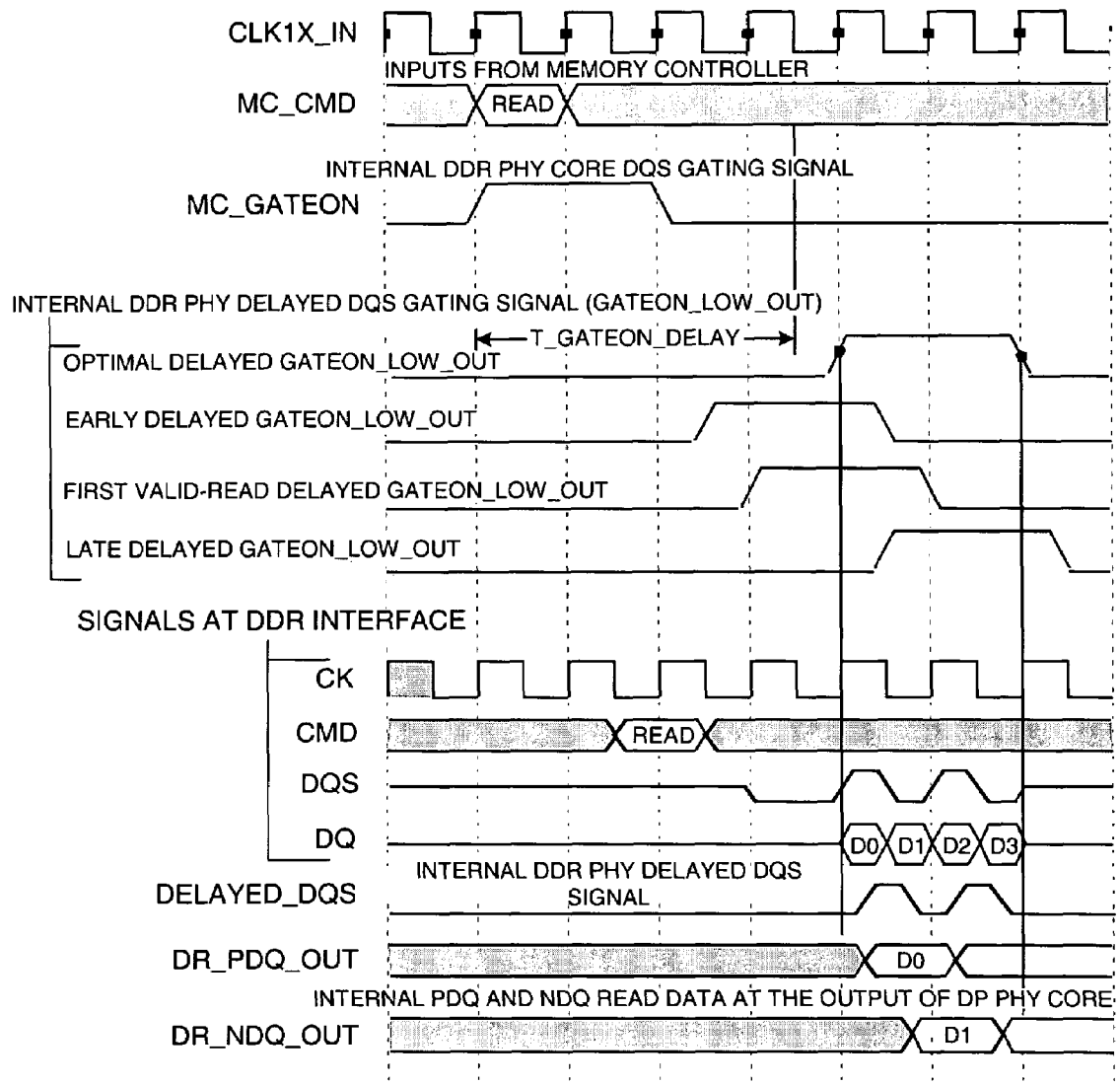
FIGS. 9-23 are timing diagrams illustrating signal relationships for various operating modes in accordance with preferred embodiments of the present invention.

Referring to FIG. 9, a timing diagram is shown illustrating examples of GATEON delay adjustments provided by the circuit 104.

Figure 10:
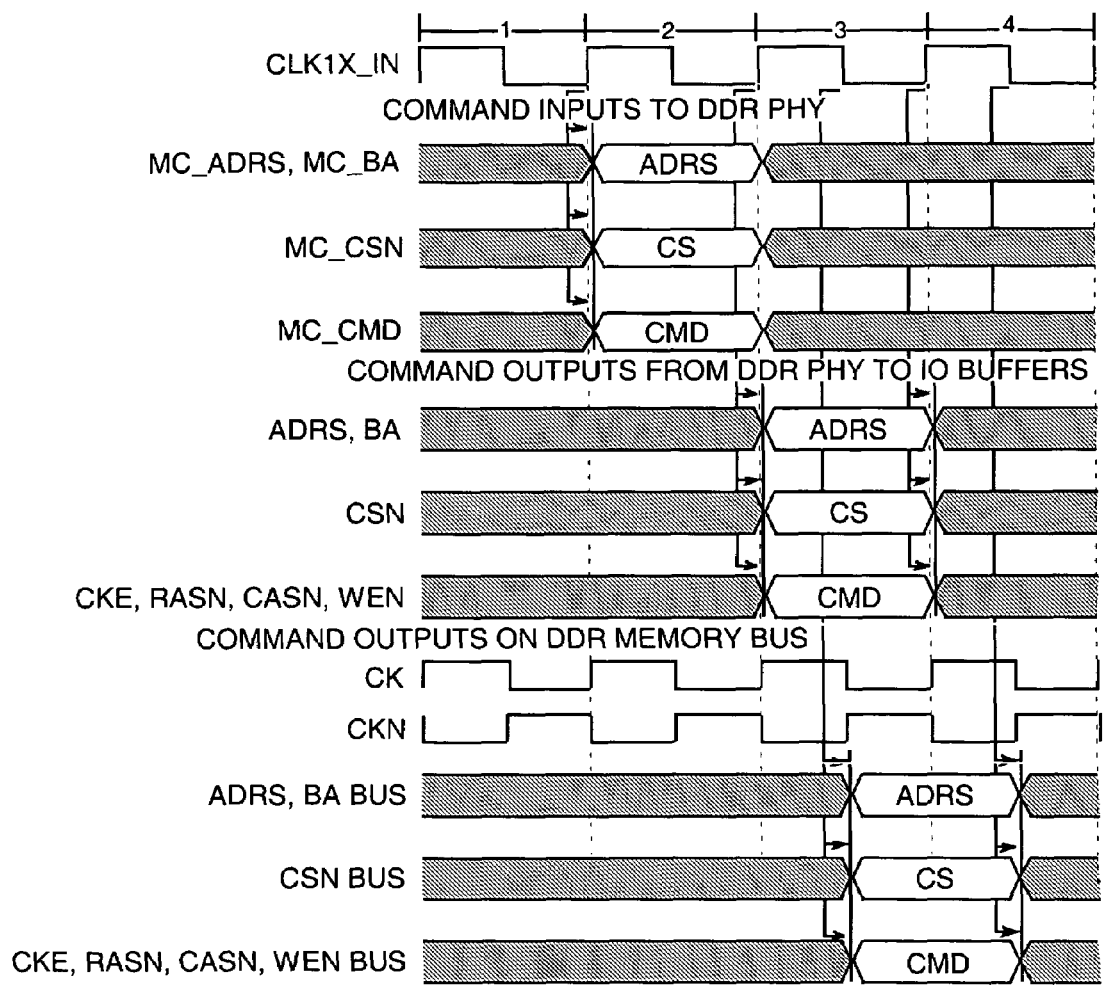

Referring to FIG. 10, a timing diagram is shown illustrating examples of the command timing between the memory controller 102, the circuit 104 and the DDR memories 106. The examples are shown with a default address phase selected (e.g., the address/command signals are 180 degrees ahead of the clock signal CLK_1X). On cycle 2 in FIG. 10, the memory controller 102 drives the command/address signals at the inputs of the circuit 104. On cycle 3, the circuit 104 drives (or presents) the address/command signals at one or more output ports. Then, in the middle of cycle 3, the address/command signals are driven on to the DDR bus by the IO buffers 108 for presentation to the memory 106.

Figure 11:
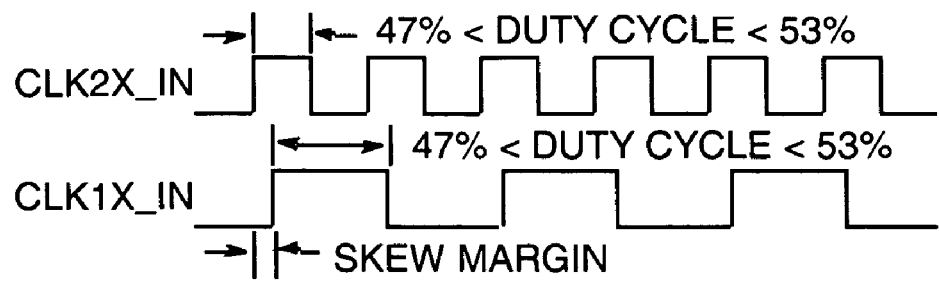

Referring to FIG. 11, a timing diagram is shown illustrating a phase relationship (e.g., skew margin) specification between the signal CLK_1X and the signal CLK_2X. The skew margin is solely determined by the device layout.

Referring to FIGS. 12-17, timing diagrams are shown illustrating examples of write timing among the memory controller (MC) 102, the core (DDR PHY) 104, and the DDR memory devices 106. On a first cycle, the MC 102 generally asserts the address and command signals with MC_W_DQS_OEn and MC_W_DQDM_OEn. In the next cycle, a signal MC_W_DQS_SW is asserted along with the data (DQ) and the data masks (DM). All signals de-asserted with the last data words. A middle portion of each of FIGS. 12-17 generally illustrate the write signals presented by the circuit 104. The timing from input to outputs generally reflects the timing of the circuit 104. A bottom portion of each of the timing diagrams generally illustrates the signals at the DDR memories 106. The timing from the output of the circuit 104 to the DDR bus generally reflects one cycle of 2x clock latency due to the flip-flop in the IO buffers 108. Each of FIGS. 12-17 generally illustrate a particular combination of data mode (x8 or x4) and Burst Length (2, 4, or 8).

Figure 18:
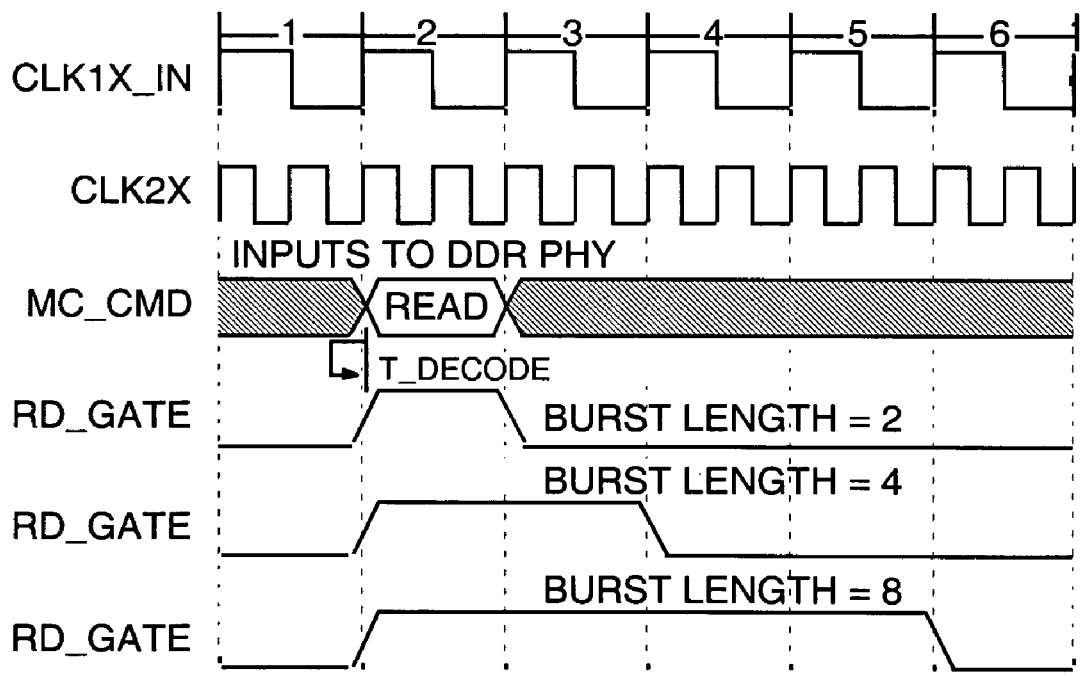
Figure 12:
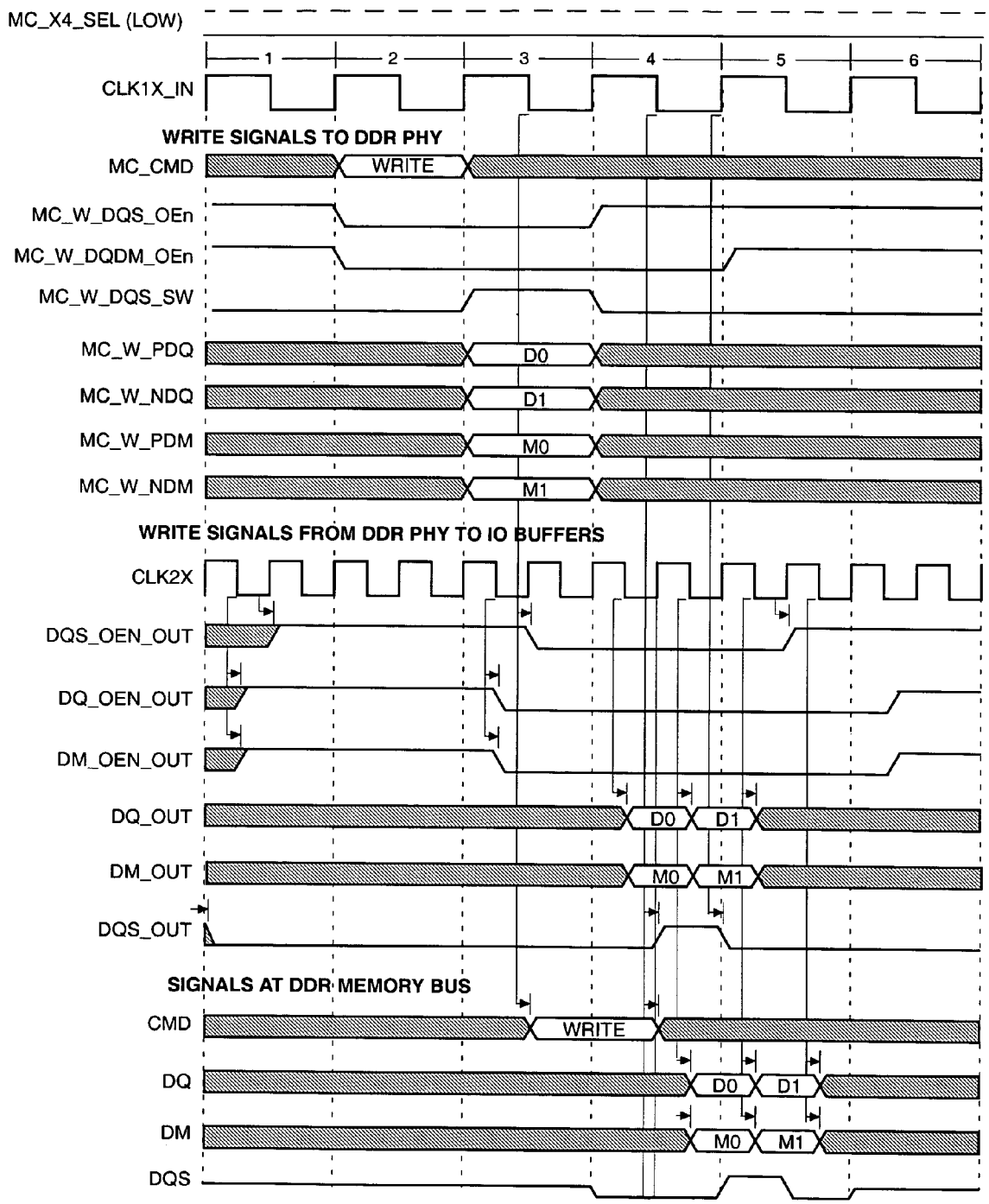
Figure 13:
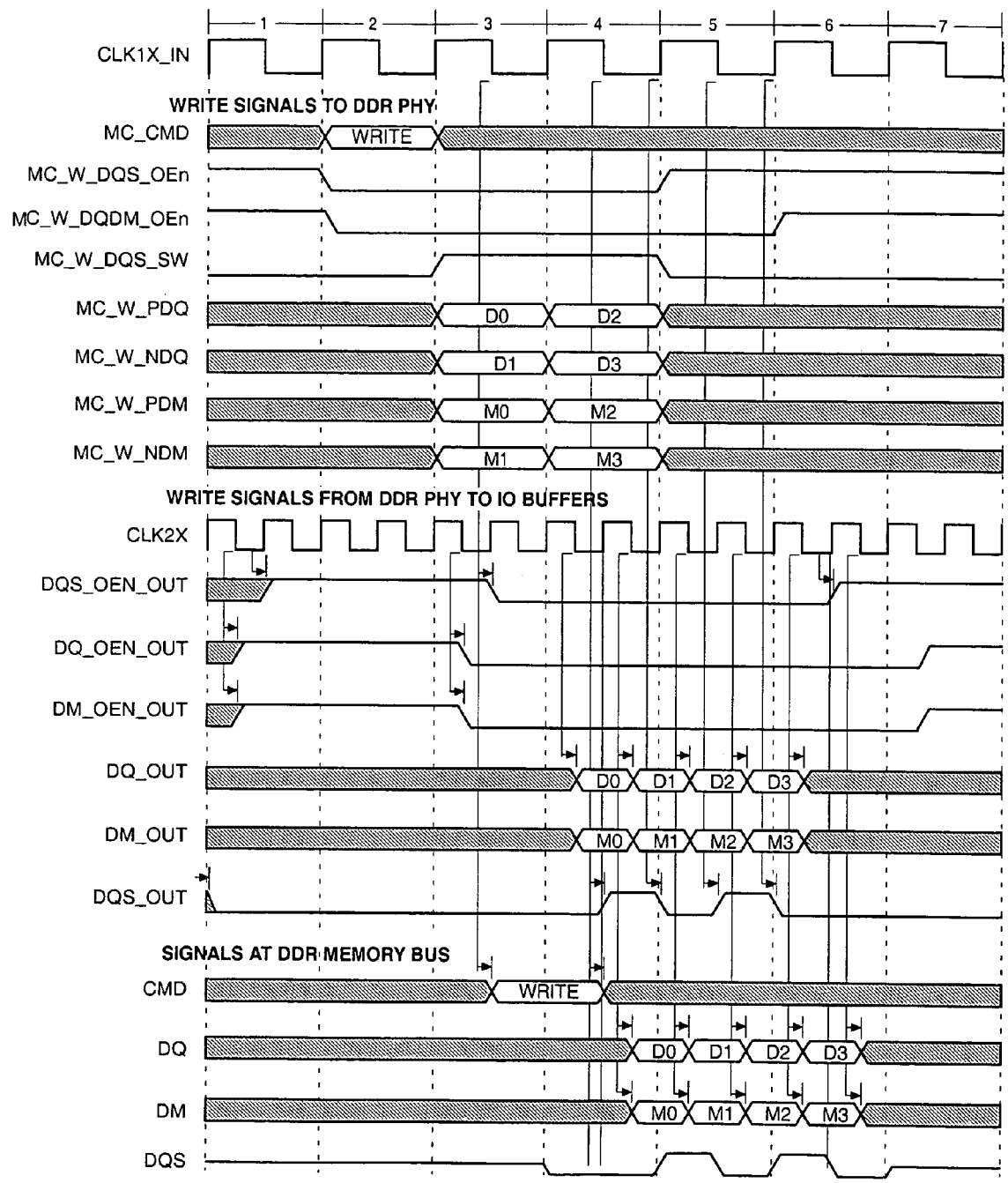
Figure 14:
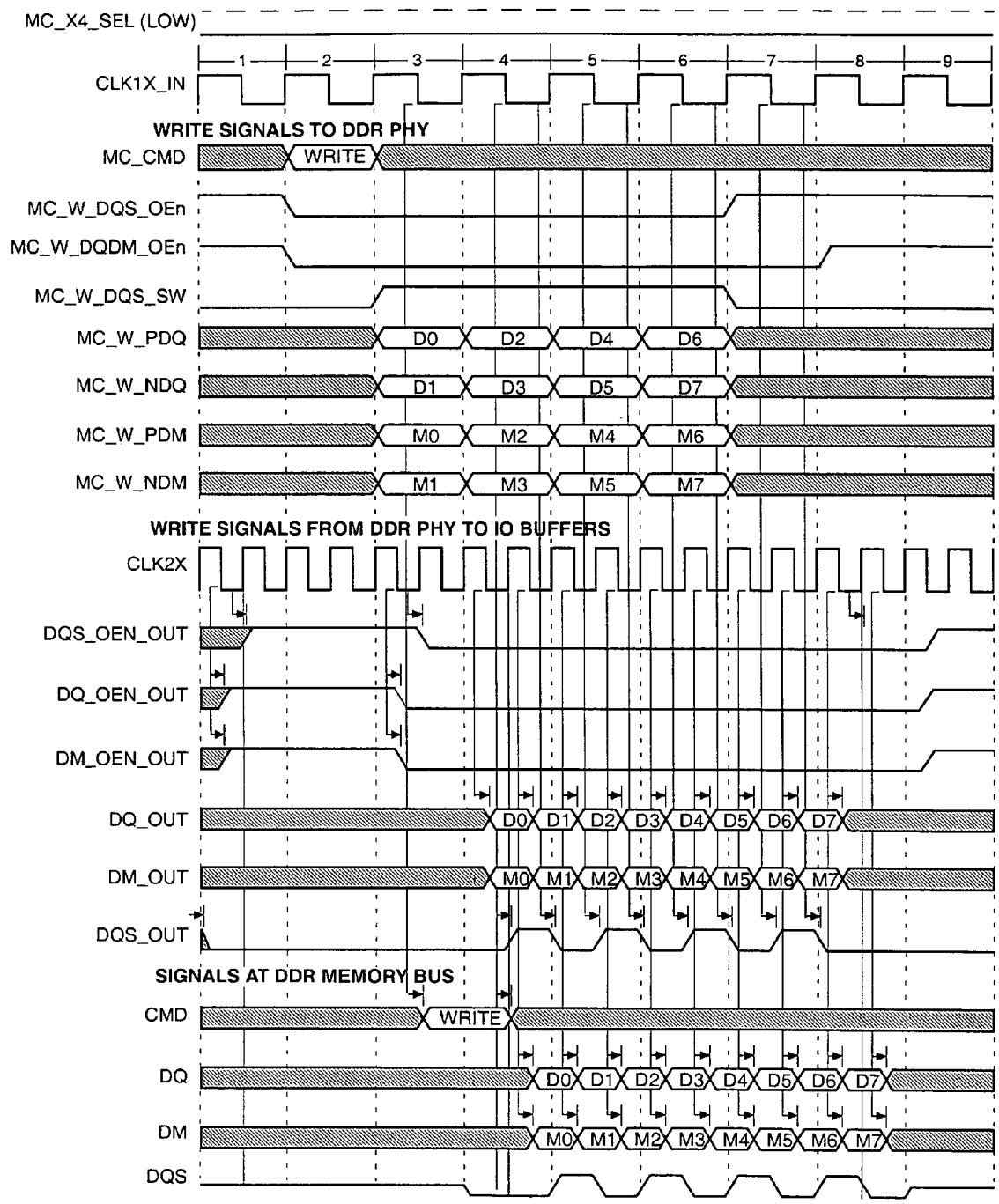
Figure 15:
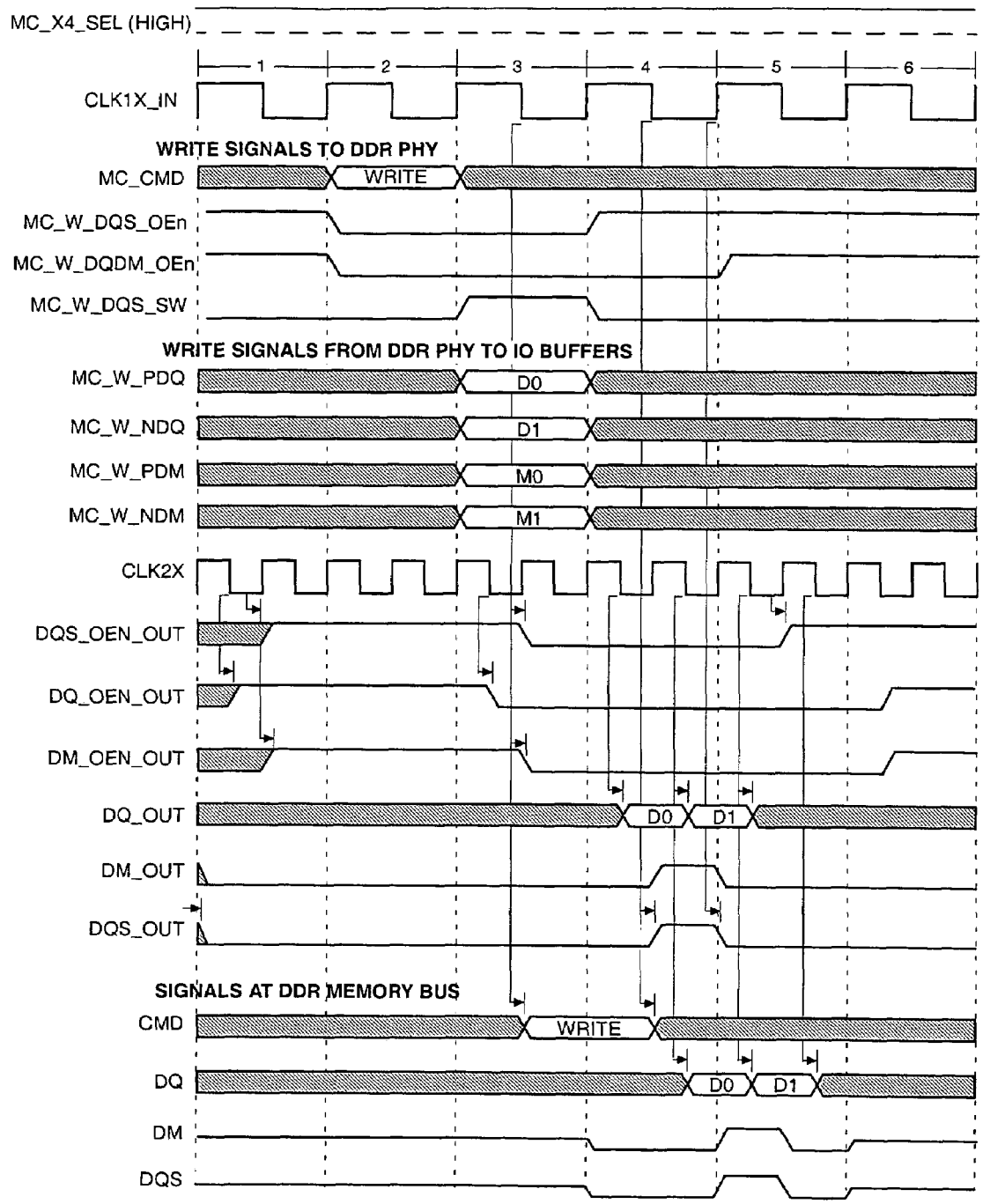
Figure 16:
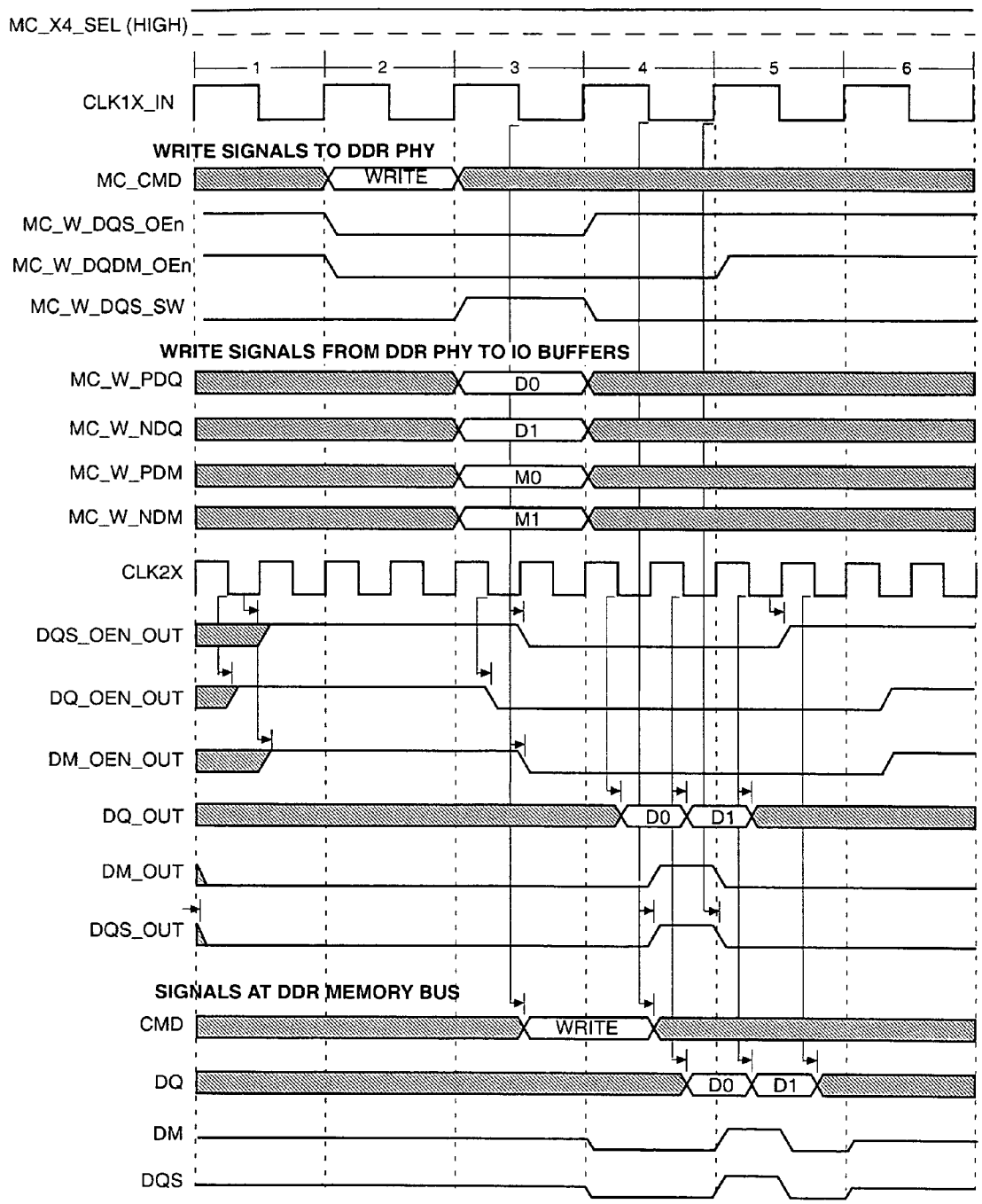
Figure 17:
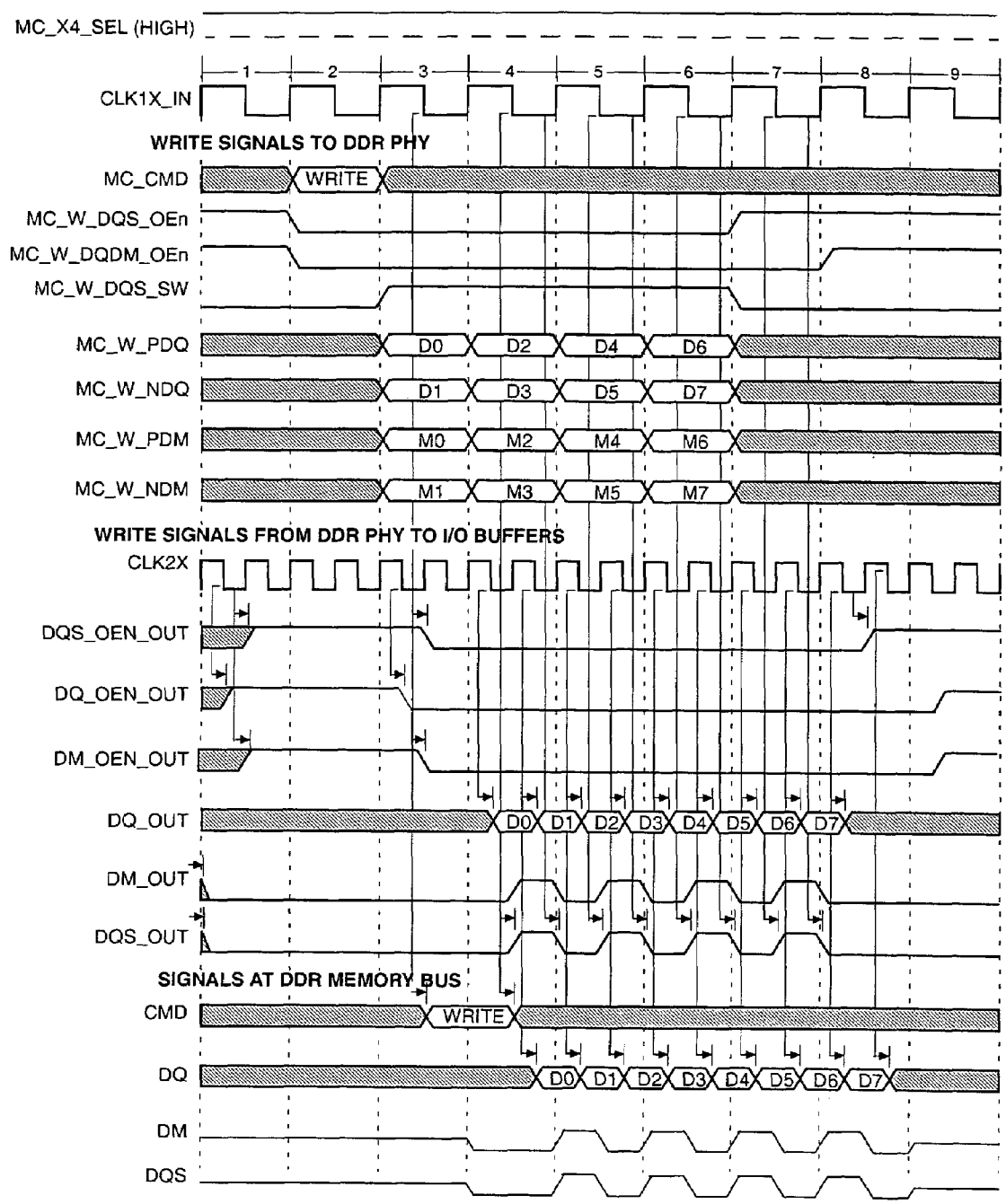

Referring to FIG. 18, a timing diagram is shown illustrating examples of timing patterns for the signal RD_GATE. Examples of the signal RD_GATE are shown for burst lengths of 2, 4, and 8. The timing pattern for the signal RD_GATE may be controlled, in one example, by a register. For example, a read gate pattern field may be implemented in a read gate pattern register. A HIGH (or logic '1') in any bit of the field may indicate that the signal RD_GATE is to be asserted for two 2x clock cycles (or one 1x clock cycle), and a LOW (or logic '0') in any bit may indicate that the signal RD_GATE is to be deasserted for two 2x clock cycles. In one example, the read gate pattern may be shifted out of the register starting with a register bit 31.

Referring to FIGS. 19-22, timing diagrams are shown illustrating examples of the read timing among the memory controller 102, the circuit 104 and the DDR memories 106. The diagrams generally illustrate the signal DQS coming from the DDR memory devices 106 gated by the read gate signal RD_GATE. The gating is prevents invalid states (e.g., when the signal DQS is in 3-state "off" mode) from being received by the circuit 104.

FIGS. 19-22 generally illustrate examples of the interface timing among the memory controller 102, the circuit 104, and the DDR bus. Burst length and Beats generally refer to the number of data words in a read cycle (e.g., either 2, 4, or 8). CAS latency generally refers to the delay from the Read command to DDR memory valid data output, specified in units of CLK_1X cycles.

The waveforms in FIGS. 19-22 may be described as follows. The read command on the MC_CMD signal ports starts the read timing sequence. An internal signal RD_GATE is generated by decoding the read command on the MC_MD signals. The signal DQS is shown after being delayed to position the signal DQS in the middle of DQ data window. The signals DR_PDQ_OUT and DR_NDQ_OUT are the outputs of the internal data registers clocked by the rising and falling edge of the signal delayed_DQS. The position of the signal delayed_DQS with respect to the clocks is shown simplified to make the overall timing easier to understand. The actual position of the signals DQS and DQ may be skewed with respect to the clocks by propagation delay. The read timing signals may be programmed to account for the propagation delay. To vary the read timing, the read timing signal RD_GATE may be programmed. The programmability of the signal RD_GATE generally provides flexibility allowing the circuit 104 to accommodate different CAS latencies, burst lengths of 2, 4, or 8, as well as propagation delays.

The circuit 104 may be configured to use the signal RD_GATE to gate a clean version of the signal DQS into the circuit 104. The leading edge is asserted during the valid LOW DQS preamble, and is deasserted (e.g., by the last falling edge of the signal DQS, plus a delay) during the valid LOW DQS postamble.

Figure 19A:
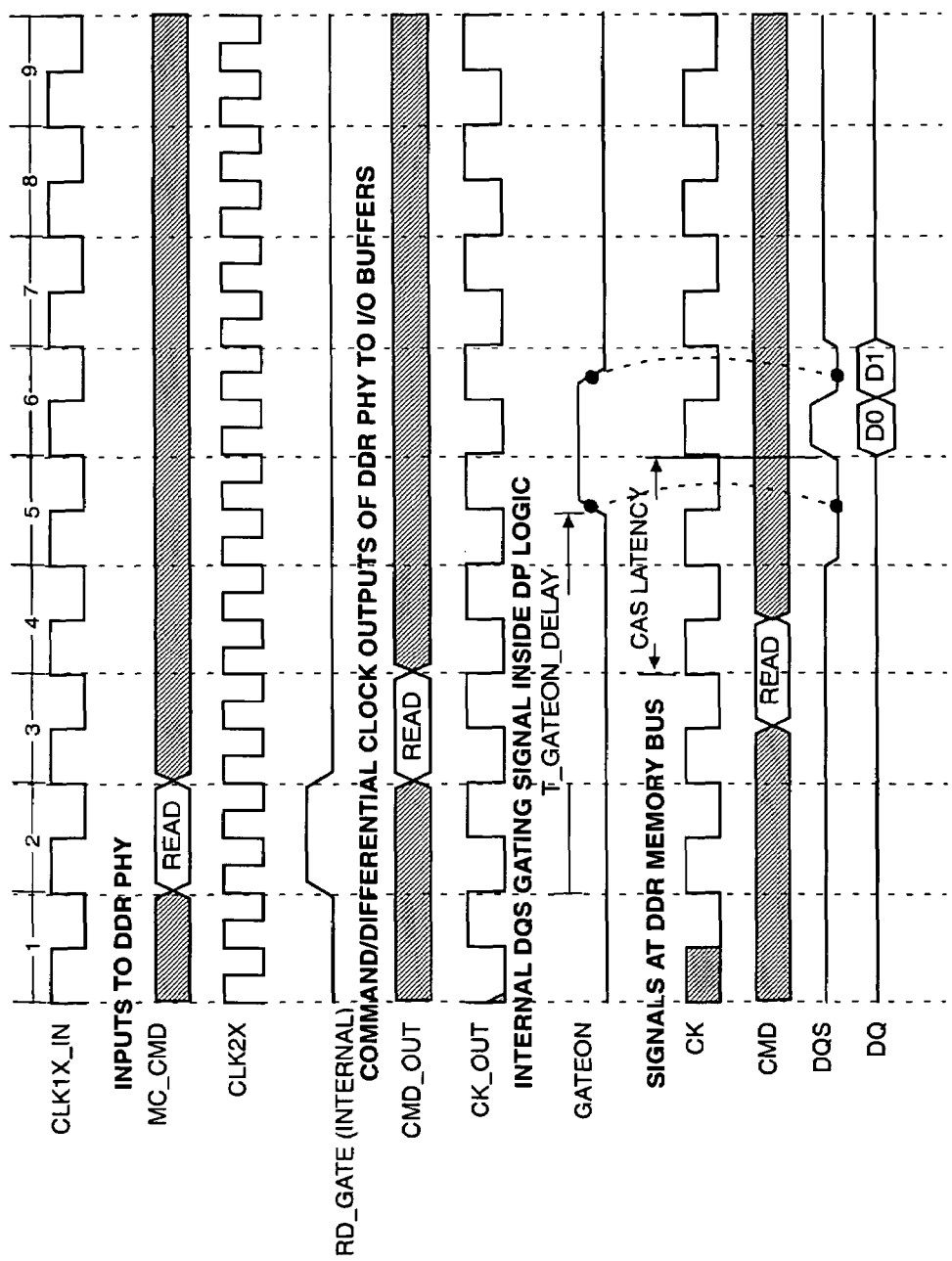
Figure 19B:
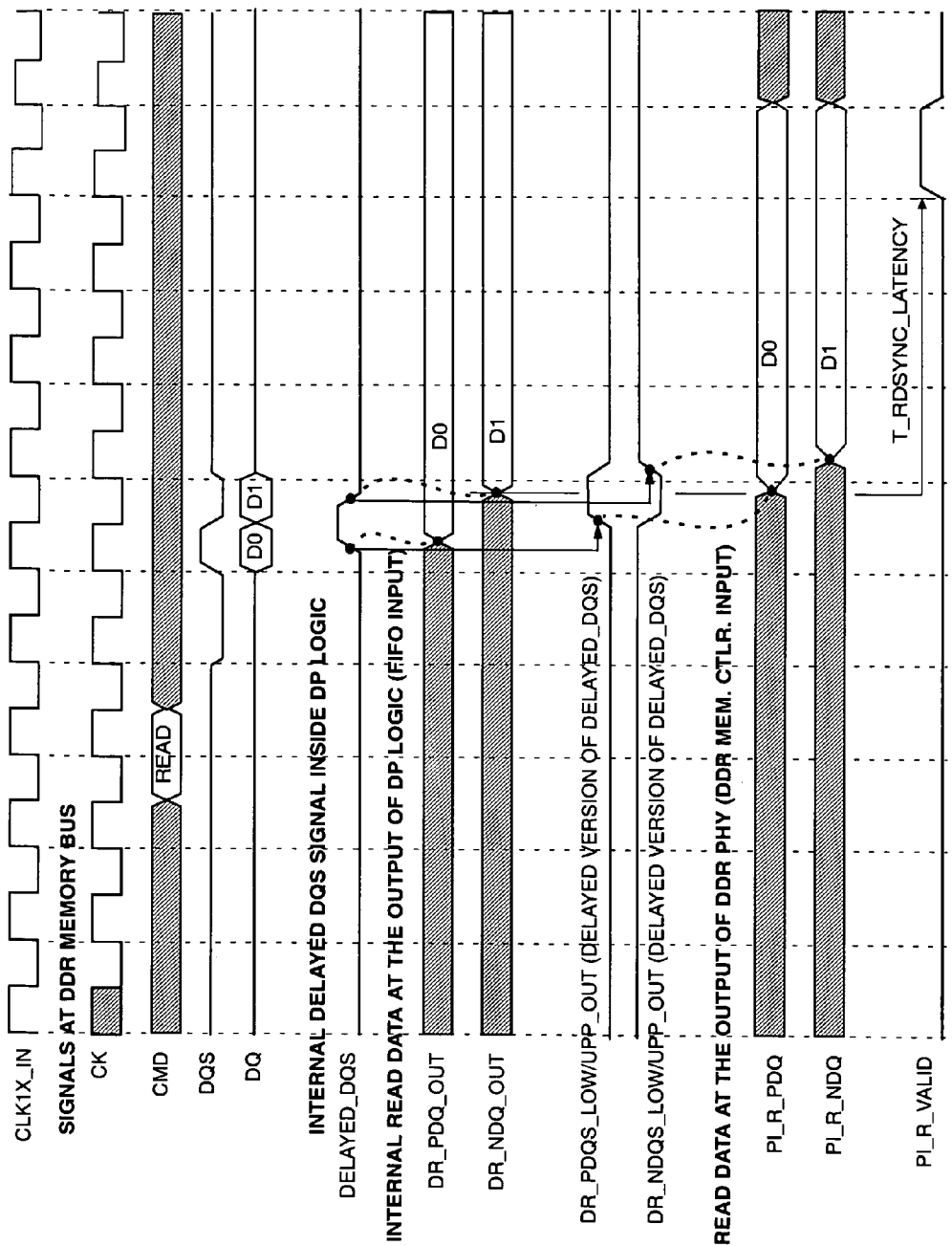
Figure 20B:
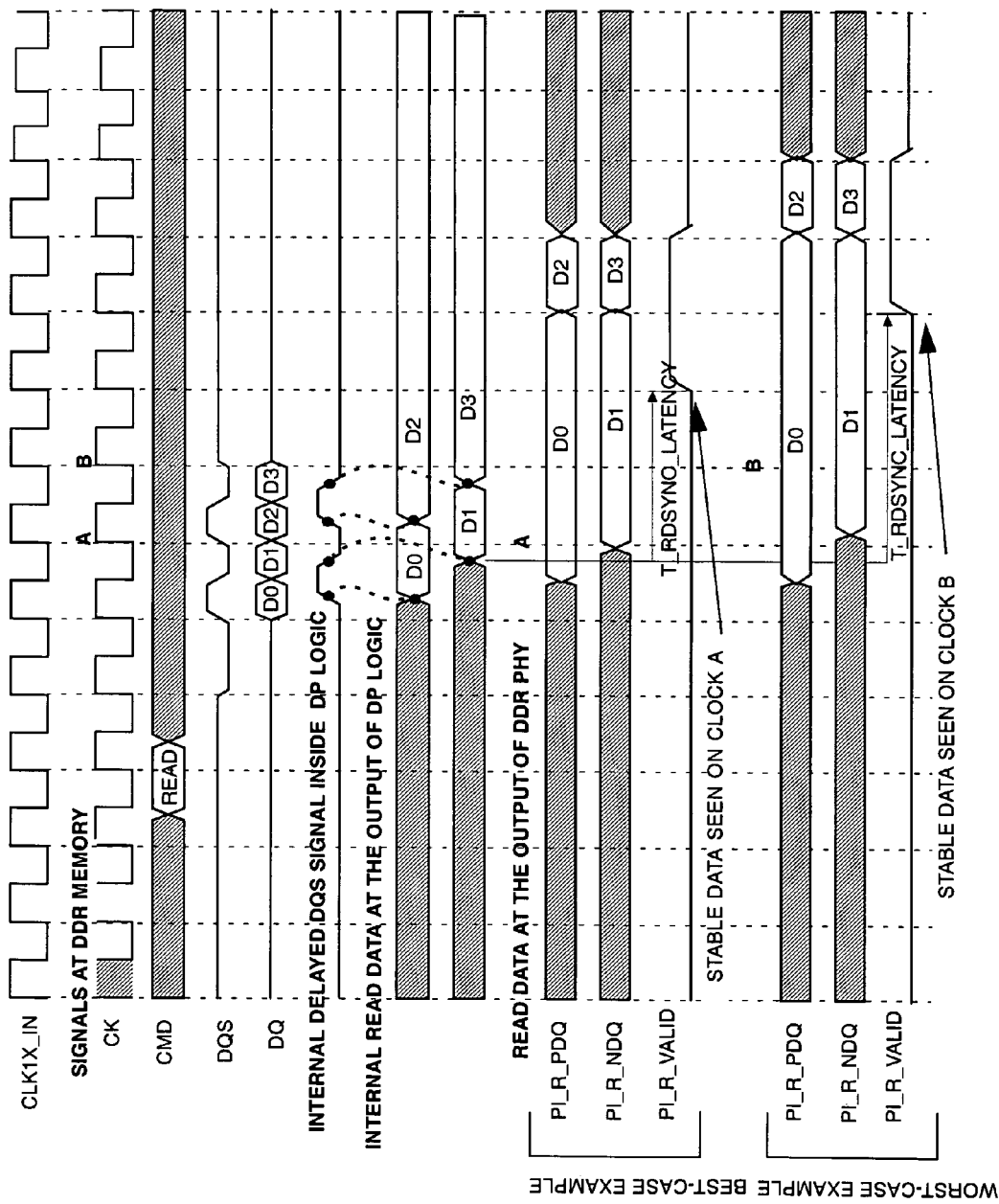
Figure 21B:
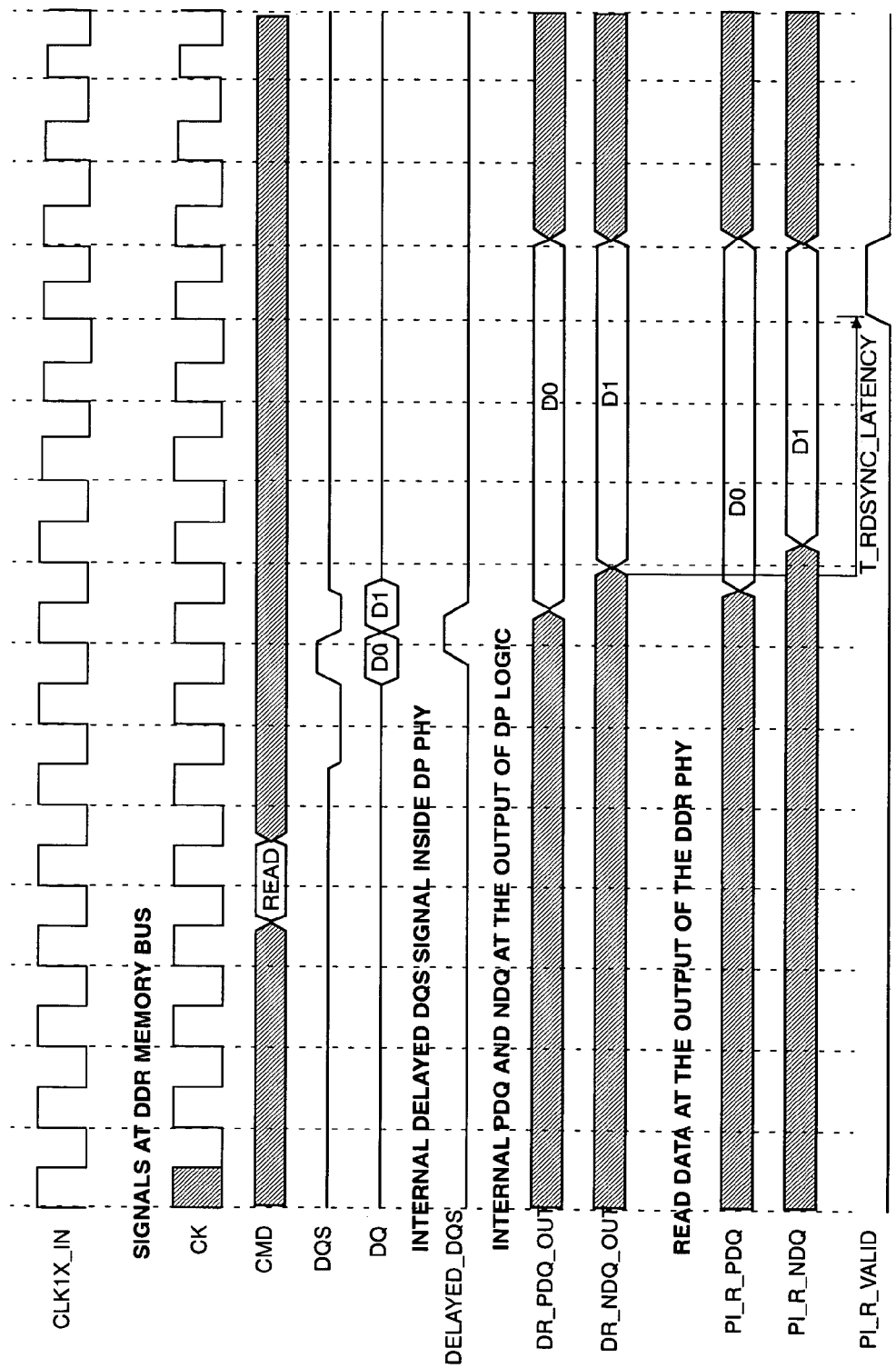
Figure 22B:
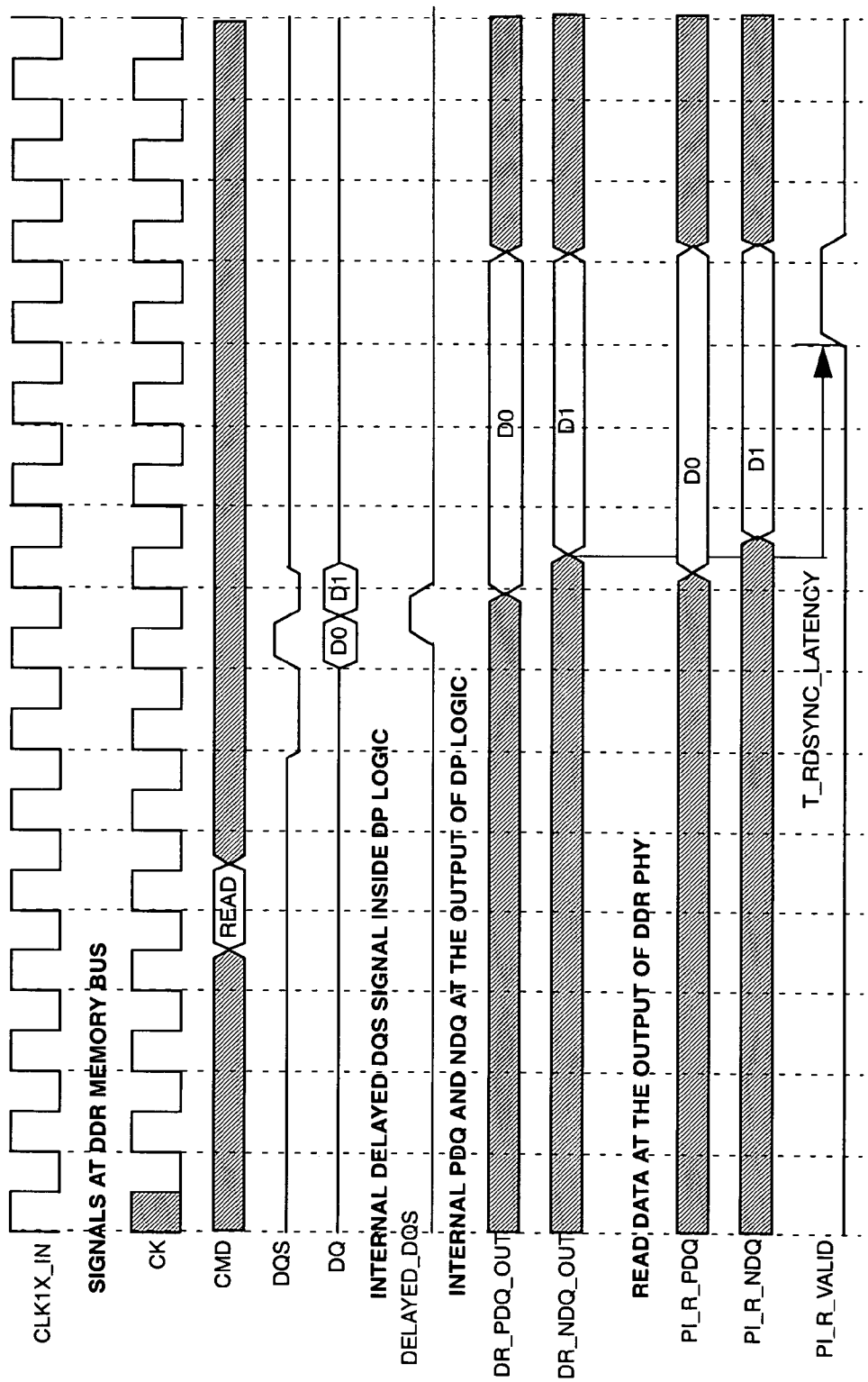

In FIG. 19 the signal RD_GATE is shown asserted for one cycle due to the transaction with burst length of 2. Likewise, in FIG. 20, the signal RD_GATE is shown asserted for two cycles due to the transaction burst length of 4. FIGS. 21 and 22 generally illustrate read timing examples with CAS latencies (CL) of 2.5 and 3. The latency, or delay, of the signal t_gateon_delay may be determined by a value in a register (e.g., a PHY GATEON Delay X Register, where X represents one of a number of GATEON Delay registers configured to control from 1 to 18 byte-wide data paths). The time period t_rdsync_latency generally represents the latency from sampling the last valid PI_R_NDQ data inside the FIFO to the first assertion of the signal PI_R_VALID. The assertion period of the signal PI_R_VALID is generally equal to the burst length divided by 2, in CLK_1X cycles.

Figure 23:
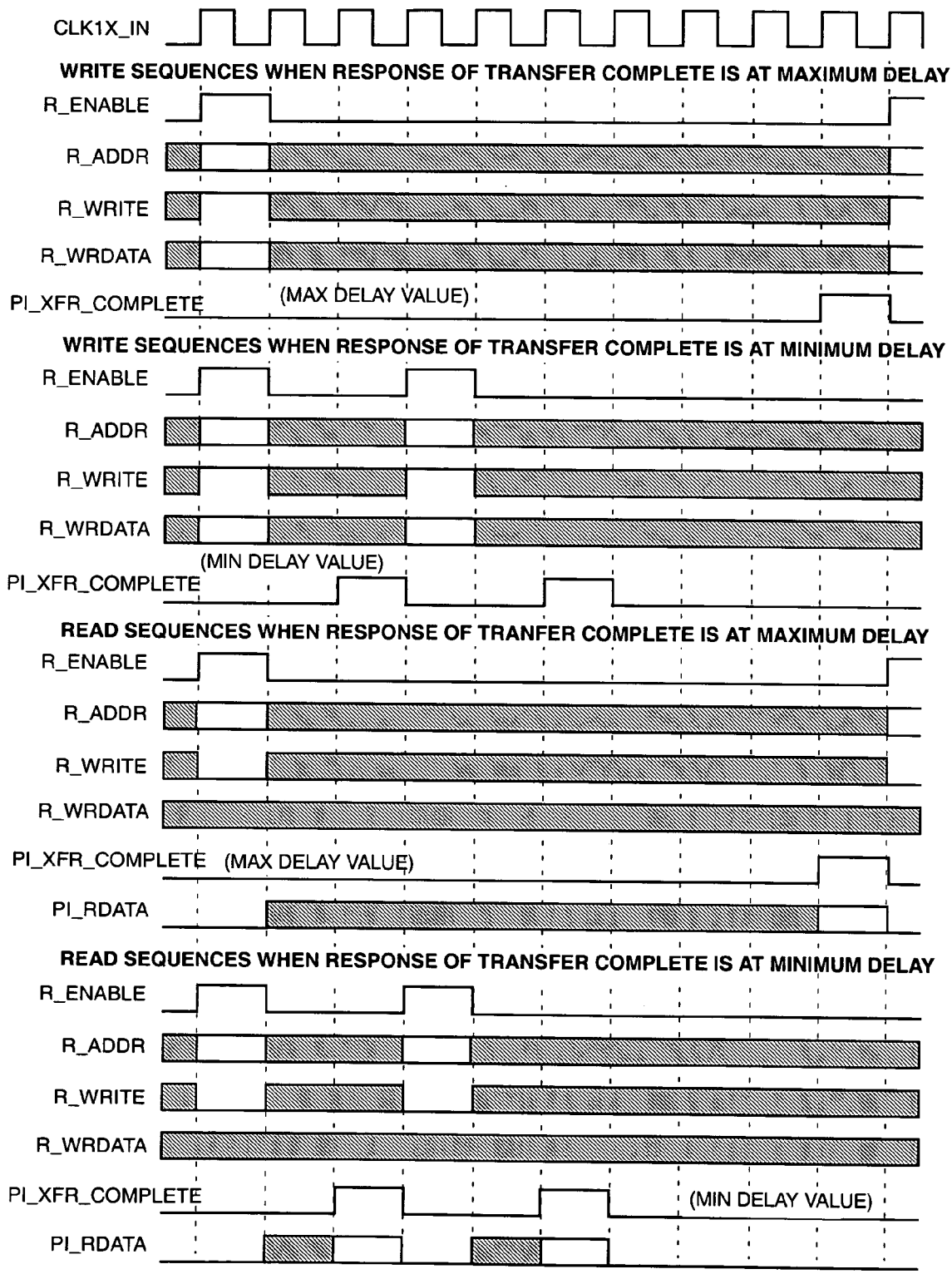

Referring to FIG. 23, a timing diagram is shown illustrating example timing for a simple register interface for reading and writing internal control registers of the circuit 104. When the signal R_ENABLE_PHY is HIGH, the circuit 104 generally loads the addressed register with the data on the R_WRDATA bus, provided the signal R_WRITE is HIGH. If the signal R_WRITE is LOW, the circuit 104 reads the addressed register and drives the read data onto the PI_RDATA bus. All transactions are synchronous with respect to the rising edge of the signal CLK_1X. A flag (e.g., PI_XFR_COMPLETE) may be implemented to indicate that in the case of a write transfer, the write has completed. In the case of a read transfer, the flag PI_XFR_COMPLETE may be configured to indicate that the read data is stable and ready to be captured.

The present invention generally defines a complete physical interface for DDR SDRAM memory applications. The present invention may provide a flexible solution to handle different data bus width, address bus width, and/or signal function pins by a configurable IP. The present invention may also automatically align the receive data from synchronous read data FIFO over PVT. The present invention may provide a truly synchronous receive data path to upper memory controller function. In addition, the present invention may integrate all low level physical data transfer functions and IO buffer housekeeping functions. The present invention may automatically track one-quarter or one-fifth cycle delay over process, voltage, and temperature (PVT) corners on the receive data path. The present invention may provide an automatic impedance update function for the IO buffers. The present invention may also provide a control mechanism for fine tuning of a DQS strobe in DDR SDRAM memory technology to enable realization of high speed applications.

The present invention may provide a number of advantages. The present invention may provide reusable IP in a variety of DDR applications, for example, DDR1, DDR2, FCRAM-1 (fast cycle random access memory 1) and/or proprietary chip-to-chip DDR interfaces. The present invention may provide a single IP that supports different bus configurations or different system bus topologies. The present invention may enable an easy product implementation and migration path by providing similar physical interfaces to upper level memory controller function. The present invention may provide a subsystem function that encapsulates all low-level physical data transfer and IO buffer housekeeping functions for the DDR2/DDR1/proprietary DDR interfaces.

As used herein, the word assert generally means to drive a signal true or active. The word deassert generally means to drive a signal false or inactive. The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

The functions performed by the present invention may be implemented using a conventional general purpose_digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAS, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMS, RAMs, EPROMS, EEPROMS, Flash memory, magnetic or optical'cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A core comprising:
a write logic intellectual property (IP) block configured to communicate data from a memory controller to a double data rate (DDR) synchronous dynamic random access memory (SDRAM);
a read logic IP block configured to communicate data from said double data rate (DDR) synchronous dynamic random access memory (SDRAM) to said memory controller, wherein said read logic IP block comprises a plurality of physical read datapaths, each of the physical read datapaths configured to receive (i) a respective portion of read data signals from the DDR memory, (ii) a respective read data strobe signal associated with the respective portion of the received read data signals, (iii) a gating signal, (iv) a base delay signal and (v) an offset delay signal;
a master delay IP block configured to receive a reference clock and generate (i) one or more delays for said read logic IP block and (ii) a lock signal; and
an address and control logic IP block configured to control said write logic IP block and said read logic IP block, wherein said core is configured to couple said double data rate (DDR) synchronous dynamic random access memory (SDRAM) and said memory controller.

2. The core according to claim 1, wherein said core is configured to provide a complete physical interface between said DDR SDRAM and said memory controller.

3. The core according to claim 1, wherein said DDR SDRAM comprises one or more external memory devices.

4. The core according to claim 1, wherein said memory controller is instantiated on an application specific integrated circuit (ASIC) comprising said core.

5. The core according to claim 1, wherein said memory controller is external to an application specific integrated circuit (ASIC) comprising said core.

6. The core according to claim 1, wherein one or more bus widths of said core are configurable at compile time.

7. The core according to claim 1, wherein said core is configured to automatically align received data over process, voltage and temperature corners.

8. The core according to claim 1, wherein the IP blocks comprise:
one or more datapaths configured to communicate data between said DDR SDRAM and said memory controller; and
one or more synchronous first-in first-out (FIFO) memories configured to couple said one or more datapaths to said memory controller.

9. The core according to claim 1, wherein the IP blocks comprise:
a plurality of registers, wherein each of said registers is configured to control a function of said core.

10. The core according to claim 1, wherein said core is further configured to implement one or more interfaces selected from the group consisting of (i) a fast cycle random access memory 1 (FCRAM-1) protocol and (ii) a proprietary chip-to-chip double data rate (DDR) interface.

11. The core according to claim 1, wherein said master delay IP block comprises a delay lock loop (DLL) and said lock signal indicates a locked state of the DLL.

12. The core according to claim 1, wherein said one or more delays for said read logic IP block comprise a one-quarter cycle delay with respect to the reference clock.

13. The core according to claim 1, wherein said one or more delays for said read logic IP block comprise a one-fifth cycle delay with respect to the reference clock.

14. The core according to claim 1, wherein each of the physical read datapaths has a set of base delay values that are independent of the other physical read datapaths.

15. The core according to claim 14, wherein each of the physical read datapaths is configured to add respective offset delay values to the respective base delay values.

16. The core according to claim 15, wherein each of the physical read datapaths is configured to subtract the respective offset delay values from the respective base delay values.

17. The core according to claim 15, wherein each of the physical read datapaths is configured to store respective slave delay adjustment values based on the respective offset delay values and the respective base delay values.

18. The core according to claim 15, wherein each of the physical read datapaths is programmed with offset delay values corresponding to each nibble of each datapath byte.

* * * * *